(12) United States Patent
Yen

(10) Patent No.: US 7,518,415 B2
(45) Date of Patent: Apr. 14, 2009

(54) VOLTAGE BUFFER AND SOURCE DRIVER THEREOF

(75) Inventor: Chih-Jen Yen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 169 days.

(21) Appl. No.: 11/554,044

(22) Filed: Oct. 30, 2006

(65) Prior Publication Data

US 2008/0042689 A1    Feb. 21, 2008

(30) Foreign Application Priority Data

Aug. 15, 2006   (TW) ................................ 95129854 A

(51) Int. Cl.
*H03K 3/00* (2006.01)
(52) U.S. Cl. ........................................ 327/108; 326/87
(58) Field of Classification Search .................. 326/29, 326/83, 86–87; 327/108–109, 170–175, 327/112, 280, 332; 330/75, 83, 270–271, 330/290–291, 250–252; 345/212
See application file for complete search history.

(56) References Cited

U.S. PATENT DOCUMENTS

| | | | |
|---|---|---|---|
| 5,471,171 A * | 11/1995 | Itakura et al. ............... 330/253 |
| 6,169,509 B1 * | 1/2001 | Abe ............................ 341/150 |
| 6,265,921 B1 * | 7/2001 | Heinrich ..................... 327/170 |
| 6,392,485 B1 * | 5/2002 | Doi et al. .................... 330/253 |
| 6,411,162 B2 * | 6/2002 | Minamizaki et al. ........ 330/255 |
| 6,448,836 B2 * | 9/2002 | Kokubun et al. ............ 327/307 |
| 6,717,468 B1 * | 4/2004 | Jeong et al. ................. 330/253 |
| 6,909,414 B2 * | 6/2005 | Tsuchi et al. ................ 345/89 |
| 7,027,027 B2 * | 4/2006 | Minamizaki et al. ........ 345/98 |
| 7,078,941 B2 * | 7/2006 | Tsuchi ........................ 327/108 |
| 7,164,298 B2 * | 1/2007 | Sung .......................... 327/112 |

* cited by examiner

*Primary Examiner*—Rexford Barnie
*Assistant Examiner*—Christopher Lo
(74) *Attorney, Agent, or Firm*—Jianq Chyun IP Office

(57) ABSTRACT

A voltage buffer and the source driver thereof are disclosed. The above-mentioned voltage buffer includes an operational amplifier and an overdriving unit, wherein the operational amplifier outputs an output voltage. The overdriving unit is coupled between an input voltage and the operational amplifier for comparing the input voltage with the output voltage and outputting an overdriving voltage to the positive input terminal of the operational amplifier. Herein if the input voltage is greater than the output voltage, the overdriving voltage is greater than the input voltage; if the input voltage is less than the output voltage, the overdriving voltage is less than the input voltage; if the input voltage is equal to the output voltage, the overdriving voltage is equal to the input voltage.

63 Claims, 10 Drawing Sheets

US 7,518,415 B2

VOLTAGE BUFFER AND SOURCE DRIVER THEREOF

CROSS-REFERENCE TO RELATED APPLICATION

This application claims the priority benefit of Taiwan application serial no. 95129854, filed Aug. 15, 2006. All disclosure of the Taiwan application is incorporated herein by reference.

BACKGROUND OF THE INVENTION

1. Field of the Invention

The present invention generally relates to a voltage buffer. More particular, the present invention relates to a voltage buffer and the source driver thereof which are capable of enhancing the slew rate.

2. Description of Related Art

A conventional voltage buffer is usually used to deliver a voltage signal, enhance the driving capability and avoid the output voltage from being affected by a load. The voltage buffer applied in the source driver of an LCD usually comprises an operational amplifier.

FIG. 1 is a schematic circuit drawing of a conventional voltage buffer, wherein the voltage buffer 100 has a negative feedback structure implemented by coupling the output terminal of the operational amplifier 110 to the negative input terminal thereof, while the positive input terminal of the operational amplifier 110 is coupled to an input voltage VINT. In consideration of a virtual short circuit, the output voltage VOUT generated at the output terminal of the operational amplifier 110 is theoretically equal to the input voltage VINT and varies therewith.

The voltage buffer shown in FIG. 1 is applied in the source driver of an LCD. Since the load capacitance of the panel end to be driven by the source driver is quite large, the voltage buffer 100 may fail to quickly regulate the output voltage VOUT to the same level as the input voltage VINT in response to a change of the input voltage VINT. That is to say, the slew rate of the voltage buffer 100 gets lower due to a load.

Along with the increase of the dimension of an LCD, the load capacitance thereof would get larger. If the slew rate of the voltage buffer of a source driver is not effectively improved to adapt the large LCD trend, it is for sure that the LCD display quality will be degraded.

SUMMARY OF THE INVENTION

Accordingly, an objective of the present invention is to provide a voltage buffer for converting an input voltage into an overdriving voltage. The overdriving voltage varies with the input voltage, and the variation of the overdriving voltage is greater than the variation of the input voltage, so as to speed up the change of the output voltage and further to enhance the slew rate of the voltage buffer.

Another objective of the present invention is to provide a source driver having a higher slew rate by using the overdriving scheme, so that the source driver is suitable for driving a larger load capacitor and improving the LCD display quality.

To achieve the above-mentioned or other objectives, the present invention provides a voltage buffer, which includes an operational amplifier and an overdriving unit. The operational amplifier has a positive input terminal, a negative input terminal and an output terminal, wherein the output terminal of the operational amplifier is coupled to the negative input terminal, while the output terminal thereof outputs an output voltage. The overdriving unit is coupled between the input voltage and the operational amplifier for comparing the input voltage with the output voltage and outputting the overdriving voltage to the positive input terminal of the operational amplifier. Herein if the input voltage is greater than the output voltage, the overdriving voltage is greater than the input voltage; if the input voltage is less than the output voltage, the overdriving voltage is less than the input voltage; if the input voltage is equal to the output voltage, the overdriving voltage is equal to the input voltage.

In an embodiment of the present invention, the above-mentioned overdriving unit includes a voltage detector, a control unit and a voltage-regulating circuit. The voltage detector is for comparing the input voltage with the output voltage and outputting a voltage-increasing signal and a voltage-decreasing signal. The control unit is coupled to the voltage detector and regulates the output of the voltage-regulating circuit according to the voltage-increasing signal and the voltage-decreasing signal. The voltage-regulating circuit is coupled to the control unit and regulates the overdriving voltage level according to the output of the control unit.

In another embodiment of the present invention, the above-mentioned voltage-regulating circuit includes a capacitor having a first terminal and a second terminal, a first switch, a second switch, a third switch, a fourth switch, a fifth switch, a sixth switch and a seventh switch. The first switch is coupled between a charging voltage and the first terminal of the capacitor. The second switch is coupled between the second terminal of the capacitor and a ground terminal. The third switch is coupled between the second terminal of the capacitor and the input voltage, and the fourth switch is coupled between the first terminal of the capacitor and the positive input terminal of the operational amplifier. The fifth switch is coupled between the input voltage and the first terminal of the capacitor, and the sixth switch is coupled between the second terminal of the capacitor and the positive input terminal of the operational amplifier. And, the seventh switch is coupled between the positive input terminal of the operational amplifier and the input voltage.

In an embodiment of the present invention, the above-mentioned control unit outputs a charging signal, a first path signal, a second path signal and a restoration signal according to the voltage-increasing signal and the voltage-decreasing signal. If the charging signal is enabled, the first switch and the second switch are on; if the first path signal is enabled, the third switch and the fourth switch are on; if the second path signal is enabled, the fifth switch and the sixth switch are on; if the restoration signal is enabled, the seventh switch is on.

In another embodiment of the present invention, the above-mentioned voltage-regulating circuit includes a first resistor, a second resistor, a first current source, a second current source, a first switch, a second switch and a third switch. The first resistor is coupled between the first current source and the input voltage, while another terminal of the first current source is coupled to a first operation voltage. The second resistor is coupled between the input voltage and the second current source, while another terminal of the second current source is coupled to a second operation voltage. A terminal of the first switch is coupled to the common node of the first resistor and the first current source, while another terminal of the first switch is coupled to the positive input terminal of the operational amplifier. A terminal of the second switch is coupled to the common node of the second resistor and the second current source, while another terminal of the second switch is coupled to the positive input terminal of the operational amplifier. The third switch is coupled between the positive input terminal of the operational amplifier and the input voltage.

In another embodiment of the present invention, the control unit outputs the first path signal, the second path signal and the restoration signal according to the voltage-increasing signal and the voltage-decreasing signal. If the first path signal is enabled, the first switch is on; if the second path signal is enabled, the second switch is on; if the restoration signal is enabled, the third switch is on.

To achieve the above-mentioned and other objectives, the present invention provides a source driver suitable for driving an LCD panel. The source driver includes a driving unit and a plurality of the above-mentioned voltage buffers. The driving unit generates a plurality of first driving voltages according to the input display signals. The voltage buffers are coupled to the driving unit, wherein the voltage buffers are corresponding to the first driving voltages in one-to-one manner, and each voltage buffer outputs a second driving voltage according to the corresponding first driving voltage.

Each of the voltage buffers has an operational amplifier and an overdriving unit, the overdriving unit outputs an overdriving voltage to the operational amplifier according to the corresponding first driving voltage. Each of the voltage buffers shortens the time for stabilizing the corresponding second driving voltage according to the corresponding overdriving voltage, so as to make the LCD panel have a better display quality. Herein the first driving voltage refers to the input voltage of the above-mentioned voltage buffer, while the second driving voltage refers to the output voltage of the above-mentioned voltage buffer.

In response to a variation of the input voltage, the present invention uses the overdriving unit to enlarge the voltage difference between the input terminal and the output terminal of the voltage buffer. In other words, the overdriving voltage varies with the variation of the input voltage, and the variation amplitude of the overdriving voltage is greater than the variation amplitude of the input voltage. Consequently, driven by the larger voltage, the voltage level at the output terminal of the voltage buffer is altered more quickly, which contributes to enhance the slew rate thereof. For a source driver application using the voltage buffer thereof, the display quality would be effectively improved since the source driver is capable of driving the LCD panel with larger load capacitance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
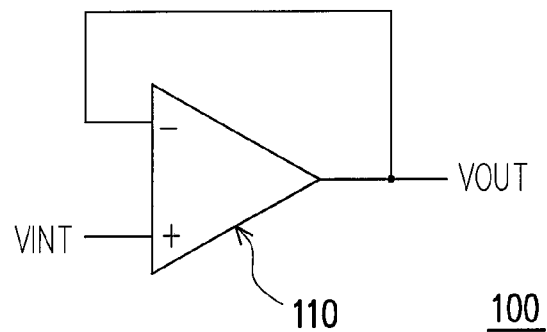
FIG. 1 is a schematic circuit drawing of a conventional voltage buffer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
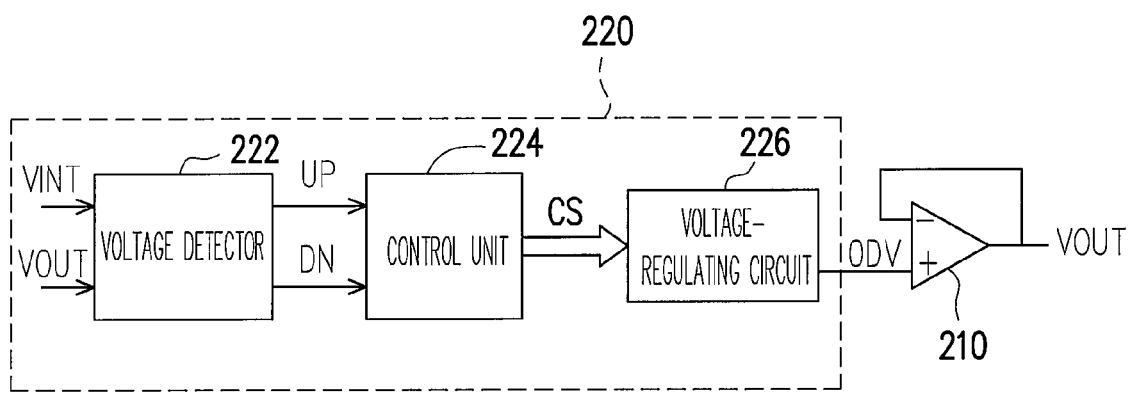
FIG. 2 is a circuit block diagram of a voltage buffer according to an embodiment of the present invention.

FIG. 2 is a circuit block diagram of a voltage buffer according to an embodiment of the present invention. A voltage buffer 200 includes an operational amplifier 210 and an overdriving unit 220. The operational amplifier 210 has a positive input terminal, a negative input terminal and an output terminal, wherein the output terminal is coupled to the negative input terminal to form a negative feedback loop. The output terminal of the operational amplifier 210 outputs an output voltage VOUT. The overdriving unit 220 is coupled between an input voltage VINT and the operational amplifier 210 for comparing the input voltage VINT with the output voltage VOUT and outputting an overdriving voltage ODV to the positive input terminal of the operational amplifier 210.

According to the comparison result of the overdriving unit 220, if the input voltage VINT is greater than the output voltage VOUT, the overdriving voltage ODV is greater than the input voltage VINT; if the input voltage VINT is less than the output voltage VOUT, the overdriving voltage ODV is less than the input voltage VINT; if the input voltage VINT is equal to the output voltage VOUT, the overdriving voltage ODV is equal to the input voltage VINT.

In other words, the overdriving unit 220 would convert the input voltage VINT into the overdriving voltage ODV according to the variation of the input voltage VINT and enlarge the voltage difference between the overdriving voltage ODV and the output voltage VOUT, so as to more quickly alter the voltage level of the output voltage VOUT of the operational amplifier 210 to fit the voltage level of the input voltage VINT and enhance the slew rate of the voltage buffer 200.

The overdriving unit 220 includes a voltage detector 222, a control unit 224 and a voltage-regulating circuit 226. The voltage detector 222 is for comparing the input voltage VINT with the output voltage VOUT and outputting a voltage-increasing signal UP and a voltage-decreasing signal DN to the control unit 224 according to the comparison result. The control unit 224 is coupled to the voltage detector 222 and regulates the output of the voltage-regulating circuit 226 according to the voltage-increasing signal UP and the voltage-decreasing signal DN. The voltage-regulating circuit 226 regulates the voltage level of the overdriving voltage ODV according to the output of the control unit 224 (in the present embodiment, the output from the control unit 224 is generally termed as a control signal CS).

When the input voltage VINT is changed, the overdriving voltage ODV varies therewith in a grater amplitude too. For example, if the input voltage VINT is increased by X volt where X is a positive number, the overdriving voltage ODV would be increased by (X+dV) where dV is a positive number. On the contrary, if the input voltage VINT is decreased by X volt, the overdriving voltage ODV would be decreased by (X+dV) too. Due to an enlarged voltage difference between the overdriving voltage ODV and the output voltage VOUT, the driving capability of the operational amplifier 210 is enhanced, which speeds up the altering course of the output voltage VOUT and increases the slew rate of the voltage buffer 200.

Since the voltage level of the overdriving voltage ODV is altered and the slew rate of the voltage buffer 200 gets advanced mainly through detecting the variation of the input voltage VINT in the present invention, hence, the implementation of the voltage detector 222, the control unit 224 and the voltage-regulating circuit 226 is not limited to one mode. In fact, the overdriving voltage ODV can be regulated by using a voltage-regulating circuit 226 in different structures in association with a control unit 224 in different structures. In the following, several circuit architectures are introduced to describe the different implementations of the voltage detector 222, the control unit 224 and the voltage-regulating circuit 226 in the present embodiment.

Figure 3A:
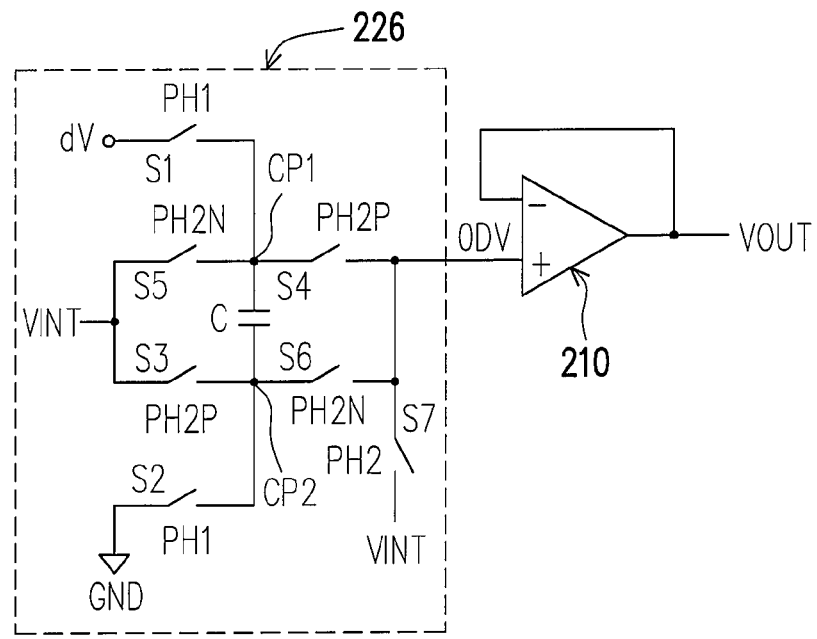
FIG. 3A is a schematic circuit drawing of a voltage-regulating circuit according to an embodiment of the present invention.
Figure 7A:
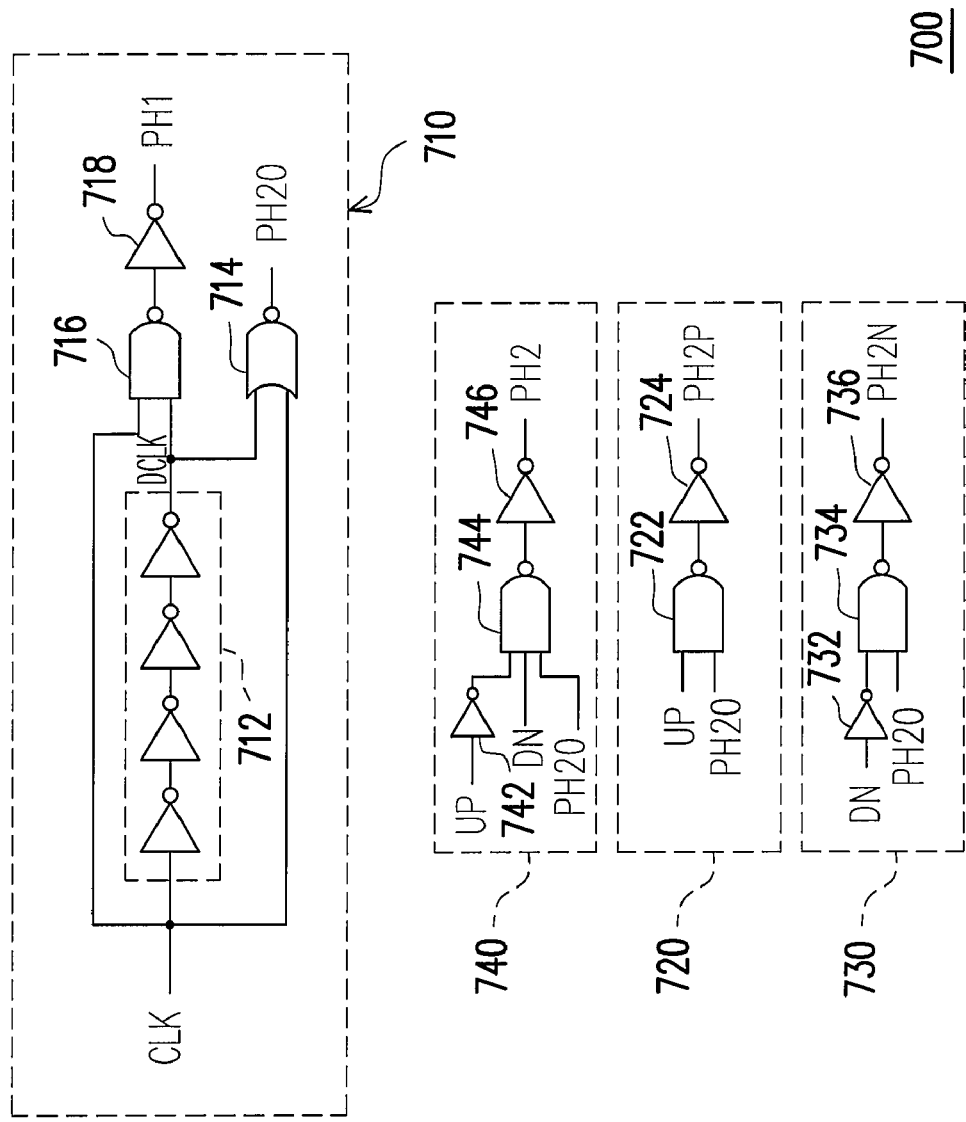
FIG. 7A is a schematic circuit drawing of a control unit according to an embodiment of the present invention.
Figure 7B:
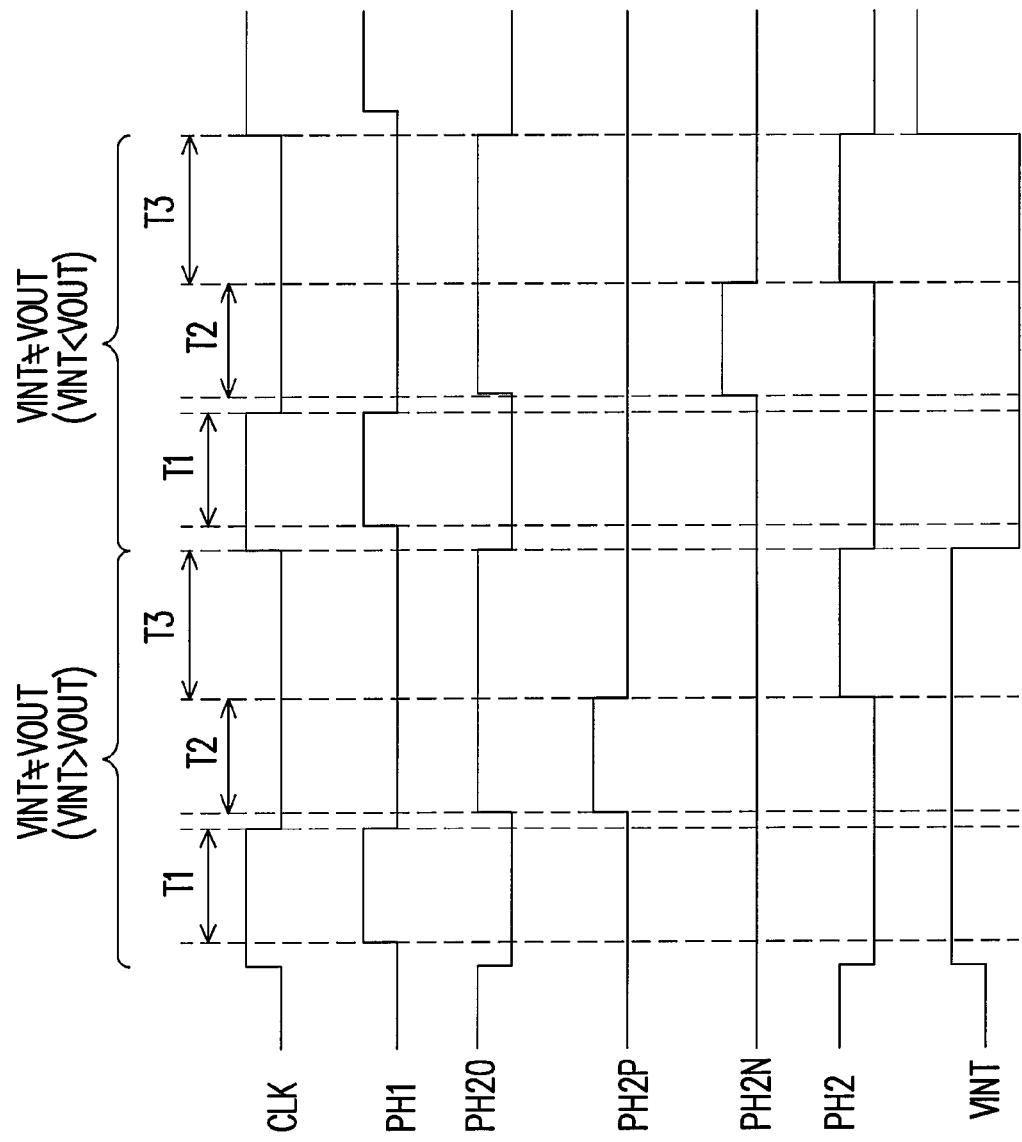
FIG. 7B is a diagram of the signals according to the embodiment of FIG. 7A.

The implementation of the voltage-regulating circuit 226 is explained as follows. FIG. 3A is a schematic circuit drawing of a voltage-regulating circuit according to an embodiment of the present invention. In the embodiment of FIG. 3A, the control signal CS output from the control unit 224 includes a charging signal PH1, a first path signal PH2P, a second path signal PH2N and a restoration signal PH2. The circuit architecture of the control unit 224 in the embodiment of FIG. 3A is illustrated by FIGS. 7A and 7B.

In the embodiment of FIG. 3A, a voltage-regulating circuit 226 is coupled to the control unit 224, regulates the voltage level of the overdriving voltage ODV according to the first path signal PH2P and the second path signal PH2N and makes the overdriving voltage ODV equal to the input voltage VINT according to the restoration signal PH2.

When the input voltage VINT is changed, the charging signal PH1 generates an enabling duration to make the voltage-regulating circuit 226 store a predetermined voltage in advance, for example, a capacitor is used to store the predetermined voltage. After that, the control unit 224 makes the first path signal PH2P or the second path signal PH2N enabled during an overdriving duration according to the comparison result between the input voltage VINT and the output voltage VOUT, i.e. the voltage levels of the voltage-increasing signal UP and the voltage-decreasing signal DN. During an overdriving duration, however, only one of the first path signal PH2P and the second path signal PH2N is enabled.

If the input voltage VINT is greater than the output voltage VOUT, the first path signal PH2P is enabled in an overdriving duration; if the input voltage VINT is less than the output voltage VOUT, the second path signal PH2N is enabled in the above-mentioned overdriving duration. After the above-mentioned overdriving duration, the restoration signal PH2 is enabled, which makes the overdriving voltage ODV equal to the input voltage VINT and avoids the voltage level of the output voltage VOUT from being altered excessively. The period of a clock signal CLK varies with the input voltage VINT; therefore, once the next input voltage VINT is input into the overdriving unit 220, an overdriving control flow is repeated again.

The voltage-regulating circuit 226 outputs the overdriving voltage ODV to the operational amplifier 210. As shown by FIG. 3A, the voltage-regulating circuit 226 includes seven switches S1-S7 and a capacitor C. The capacitor C has a first terminal CP1 and a second terminal CP2, the switch S1 is coupled between the charging voltage dV and the first terminal CP1 of the capacitor C. The switch S2 is coupled between the second terminal CP2 of the capacitor C and a ground terminal GND. The switch S3 is coupled between the second terminal CP2 of the capacitor C and the input voltage VINT and the switch S4 is coupled between the first terminal CP1 of the capacitor C and the positive input terminal of the operational amplifier 210. The switch S5 is coupled between the input voltage VINT and the first terminal CP1 of the capacitor C and the switch S6 is coupled between the second terminal CP2 of the capacitor C and the positive input terminal of the operational amplifier 210. The switch S7 is coupled between the positive input terminal of the operational amplifier 210 and the input voltage VINT. In the embodiment, the charging voltage dV is a positive voltage.

If the charging signal PH1 is enabled, the switch S1 and the switch S2 are on, which makes the charging voltage dV charge to the capacitor C, and a positive voltage difference is generated between the first terminal CP1 and the second terminal CP2 of the capacitor C. Then, if the input voltage VINT is greater than the output voltage VOUT, the first path signal PH2P is enabled in an overdriving duration and the switches S3 and S4 are on, which further makes the overdriving voltage ODV greater than the input voltage VINT. Theoretically, the overdriving voltage ODV should be greater than the input voltage VINT due to the voltage stored in the capacitor C. The voltage difference between the overdriving voltage ODV and the input voltage VINT depends on the amount of the charging voltage dV which is preset to a different value according to the different demand of an application.

If the input voltage VINT is less than the output voltage VOUT, the second path signal PH2N is enabled during the above-mentioned overdriving duration, and the switches S5 and S6 are on. The voltage difference between both terminals of the capacitor C would result in a negative voltage difference affecting the input voltage VINT, so as to make the overdriving voltage ODV less than the input voltage VINT. In this way, the operational amplifier 210 is able to speed up the course for the output voltage VOUT to be declined to the level of the input voltage VINT. After the above-mentioned overdriving duration, the restoration signal PH2 is enabled to turn on the seventh switch, meanwhile the overdriving voltage ODV would be equal to the input voltage VINT due to the turning on of the switch S7.

In summary of the above described embodiment of FIG. 3A, when the input voltage VINT is changed, the voltage-regulating circuit 226 would store charges first, followed by regulating the overdriving voltage ODV through controlling the signal-delivering path. When the input voltage VINT gets higher, the overdriving voltage ODV gets higher therewith too; when the input voltage VINT gets lower, the overdriving voltage ODV gets lower therewith and the variation amplitude of the overdriving voltage ODV is greater than the variation amplitude of the input voltage VINT. Finally, the level of the overdriving voltage ODV is regulated to the input voltage VINT. Herein during the charging duration, since the positive input terminal of the operational amplifier 210 has an equivalent parasitic capacitance relative to the ground, the overdriving voltage ODV will not suddenly drop during the enabling duration of the charging signal PH1. As long as the enabling duration of the charging signal PH1 is adjusted, the problem of the voltage drop of the overdriving voltage ODV can be alleviated.

Figure 8A:
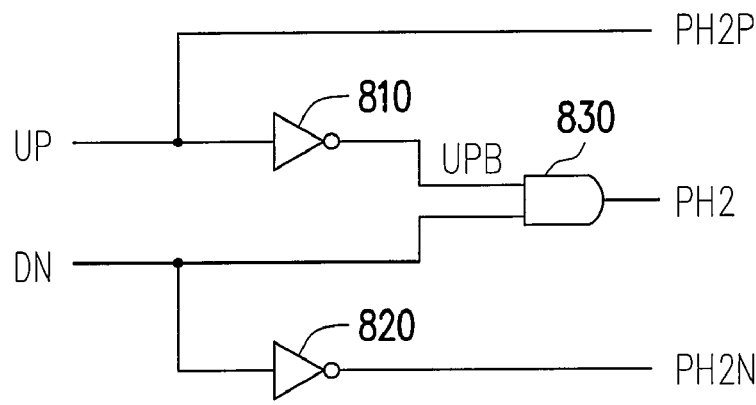
FIG. 8A is a schematic circuit drawing of a control unit according to another embodiment of the present invention.
Figure 8B:
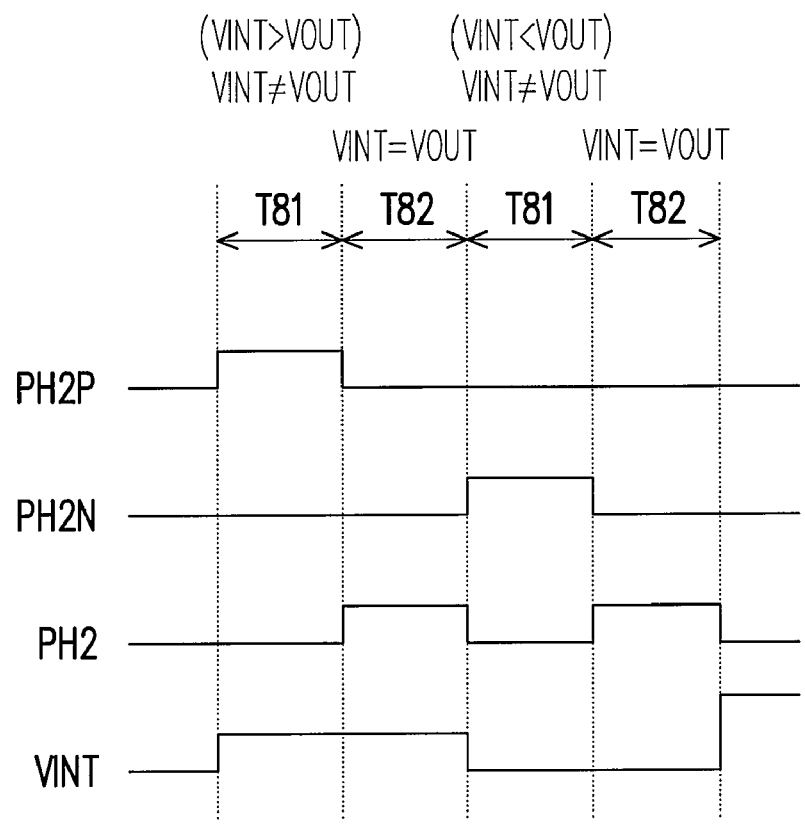
FIG. 8B is a diagram of the signals according to the embodiment of FIG. 8A.

In another embodiment of the present invention, when the charging signal PH1 or the restoration signal PH2 is enabled, or both the first path signal PH2P and the second path signal PH2N are disabled (when the input voltage VINT is equal to the output voltage VOUT), the switches S1, S2 and S7 are on at the same time. Referring to FIGS. 8A and 8B, the circuit architecture of the control unit associated with the embodiment of FIG. 3A is illustrated in the figures. When the voltage detector detects the variation of the input voltage VINT (getting higher or lower), one of the first path signal PH2P and the second path signal PH2N is enabled, so as to regulate the overdriving voltage ODV. When the input voltage VINT gets higher, the first path signal PH2P is enabled and the overdriving voltage ODV is greater than the input voltage VINT; when the input voltage VINT gets lower, the second path signal PH2N is enabled and the overdriving voltage ODV is less than the input voltage VINT; when the input voltage VINT is equal to the output voltage VOUT, the restoration signal PH2 is enabled and the overdriving voltage ODV would be equal to the input voltage VINT due to the turning on of the switch S7.

While the restoration signal PH2 is enabled, the charging signal PH1 is enabled too (note that in another embodiment of the present invention, instead of the charging signal PH1, the restoration signal PH2 is used to control the switches S1 and S2), thus, the switches S1 and S2 are on, which enables the charging voltage dV to charge the capacitor C and generates a positive voltage difference between the first terminal CP1 and the second terminal CP2 of the capacitor C. When the input voltage VINT is changed again, one of the first path signal PH2P and the second path signal PH2N would be immediately enabled to regulate the overdriving voltage ODV without charging the capacitor C in advance. In this way, not only the level of the overdriving voltage ODV is retained, but also the problem of the voltage drop of the overdriving voltage ODV as described in the previous embodiment can be avoided; moreover, the speed of the course of altering the overdriving voltage ODV and the slew rate of the voltage buffer 200 are increased. In addition, there is another advantage herein that the clock signal CLK and the nonoverlapping clock-generating circuit (710 as shown in FIG. 7A) are exempted from being employed. Therefore, the implementation of the control unit 800 in FIG. 8A is much simpler than the control unit 700 in FIG. 700.

The present embodiment mainly uses the capacitor C to store a voltage difference and converts the input voltage VINT into the overdriving voltage ODV through controlling the signal-delivering path. Due to a larger voltage difference between the overdriving voltage ODV and the output voltage VOUT, the operational amplifier 210 is capable of regulating the voltage level of the output voltage VOUT thereof more quickly, which accordingly increases the slew rate of the voltage buffer.

Figure 3B:
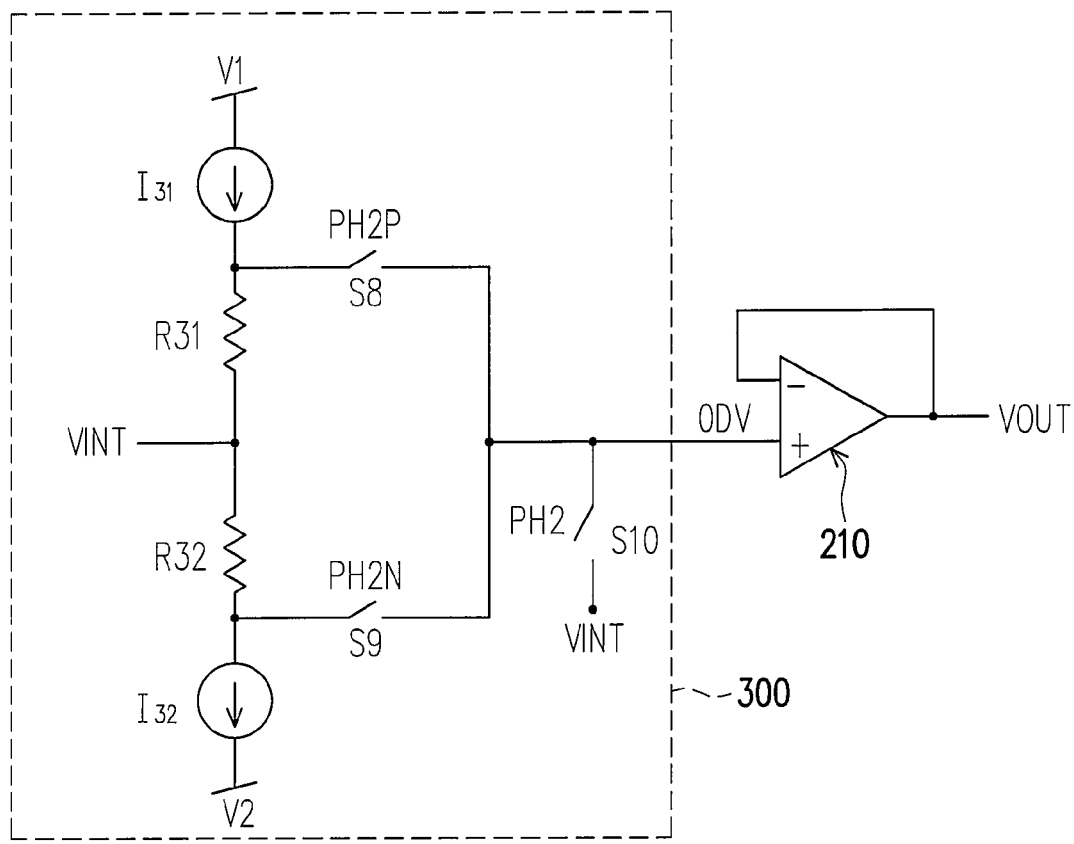
FIG. 3B is a schematic circuit drawing of a voltage-regulating circuit according to another embodiment of the present invention.

In another embodiment of the present invention, the voltage-regulating circuit 226 is implemented by another circuit. FIG. 3B is a schematic circuit drawing of a voltage-regulating circuit according to another embodiment of the present invention. In the embodiment of FIG. 3B, the control signal CS output from the control unit 224 includes a first path signal PH2P, a second path signal PH2N and a restoration signal PH2. The circuit architecture of the control unit 224 associated with the embodiment of FIG. 3B can refer to FIGS. 8A and 8B. In the embodiment of FIG. 3B, if the input voltage VINT is greater than the output voltage VOUT, the first path signal PH2P is enabled, and both the second path signal PH2N and the restoration signal PH2 are disabled; if the input voltage VINT is less than the output voltage VOUT, both the first path signal PH2P and the restoration signal PH2 are disabled and the second path signal PH2N is enabled; if the input voltage VINT is equal to the output voltage VOUT, the restoration signal PH2 is enabled, and both the first path signal PH2P and the second path signal PH2N are disabled.

The voltage-regulating circuit 300 is coupled to the positive input terminal of the operational amplifier 210 for regulating the overdriving voltage ODV. The voltage-regulating circuit 300 includes current sources $I_{31}$ and $I_{32}$, resistors R31 and R32 and switches S8, S9 and S10. The resistor R31 is coupled between the current source $I_{31}$ and the input voltage VINT, while another terminal of the current source $I_{31}$ is coupled to a first operation voltage V1. The resistor R32 is coupled between the current source $I_{32}$ and the input voltage VINT, while another terminal of the current source $I_{32}$ is coupled to a second operation voltage V2. A terminal of the switch S8 is coupled to the common node of the resistor R31 and the current source $I_{31}$, while another terminal thereof is coupled to the positive input terminal of the operational amplifier 210.

A terminal of the switch S9 is coupled to common node of the resistor R32 and the current source $I_{32}$, while another terminal thereof is coupled to the positive input terminal of the operational amplifier 210. The switch S10 is coupled between the positive input terminal of the operational amplifier 210 and the input voltage VINT. Herein, if the first path signal PH2P is enabled, the switch S8 is on; if the second path signal PH2N is enabled, the switch S9 is on; if the restoration signal PH2 is enabled, the switch S10 is on.

In other words, when the input voltage VINT is greater than the output voltage VOUT, the switch S8 is on and the overdriving voltage ODV is equal to the sum of the input voltage VINT and the voltage difference across the resistor R31 where the current of the current source $I_{31}$ passes through; when the input voltage VINT is less than the output voltage VOUT, the switch S9 is on and the overdriving voltage ODV is equal to the input voltage VINT less the voltage difference across the resistor R32 where the current of the current source $I_{32}$ passes through; when the input voltage VINT is equal to the output voltage VOUT, the switch S10 is on and the overdriving voltage ODV is equal to the input voltage VINT. Therefore, in response to a variation of the input voltage VINT, one of the switches S8 and S9 is on according to the relative magnitude between the input voltage VINT and the output voltage VOUT, so that the overdriving voltage ODV is regulated to VINT+$I_{31}$×R31 or VINT−$I_{32}$×R32. Once the output voltage VOUT gets the same as the input voltage VINT, the switch S10 is on and the overdriving voltage ODV is equal to the input voltage VINT. The present embodiment mainly uses a current of a current source passing through a resistor to generate a voltage difference between both ends of the resistor, and then converts the input voltage VINT into the overdriving voltage ODV through controlling the signal-delivering path. Herein, due to a larger level difference between the overdriving voltage ODV and the output voltage VOUT, the operational amplifier 210 is able to regulate the level of the output voltage VOUT more quickly, which further enhances the slew rate of the voltage buffer.

In the following, the voltage detector in the embodiment is explained in more detail. The voltage detector 222 is mainly for comparing the input voltage VINT with the output voltage VOUT and accordingly outputting a voltage-increasing signal UP and a voltage-decreasing signal DN. The control unit 224 generates an appropriate control signal to control the voltage-regulating circuit and regulate the level of the over-driving voltage ODV according to the comparison result.

Figure 4:
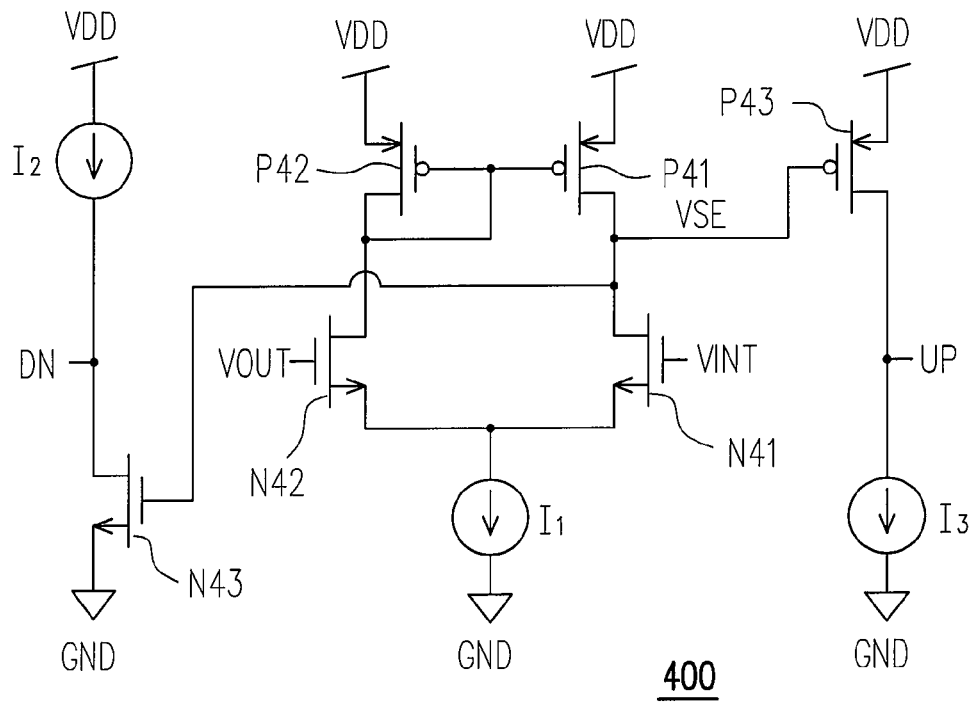
FIG. 4 is a schematic circuit drawing of a voltage detector according to an embodiment of the present invention.

FIG. 4 is a schematic circuit drawing of a voltage detector according to an embodiment of the present invention. A voltage detector 400 includes PMOS transistors P41-P43, NMOS transistors N41-N43 and current sources $I_1$, $I_2$ and $I_3$. The PMOS transistor P41 and the NMOS transistor N41 are in series connection to each other and together coupled between the operation voltage VDD and the current source $I_1$, while the gate of the NMOS transistor N41 is coupled to the input voltage VINT.

The PMOS transistor P42 and the NMOS transistor N42 are in series connection to each other and together coupled between the operation voltage VDD and the current source $I_1$. The gate of the NMOS transistor N42 is coupled to the output voltage VOUT, the gate of the PMOS transistor P42 is coupled to the gate of the PMOS transistor P41 and the gate of the PMOS transistor P42 is coupled to the common node of the PMOS transistor P42 and the NMOS transistor N42. The current source $I_2$ and the NMOS transistor N43 are in series connection to each other and together coupled between the operation voltage VDD and the ground terminal GND, while the gate of the NMOS transistor N43 is coupled to the common node of the PMOS transistor P41 and the NMOS transistor N41. The common node of the current source $I_2$ and the NMOS transistor N43 outputs the voltage-decreasing signal DN.

The PMOS transistor P43 and the current source $I_3$ are in series connection to each other and together coupled between the operation voltage VDD and the ground terminal GND, the gate of the PMOS transistor P43 is coupled to the common node of the PMOS transistor P41 and the NMOS transistor N41 and the common node of the PMOS transistor P43 and the current source $I_3$ outputs the voltage-increasing signal UP.

Since both gate voltages of the PMOS transistor P41 and the PMOS transistor P42 are equal to each other, and the sources thereof are coupled to the operation voltage VDD, therefore, the drain voltages of the PMOS transistors P41 and P42 are regulated mainly through changing the currents passing through the PMOS transistors P41 and P42. When the input voltage VINT is greater than the output voltage VOUT, the current passing through the PMOS transistor P41 gets larger (must be equal to the current passing through the NMOS transistor N41). Thus, the drain voltage level of the PMOS transistor P41 would be dropped to keep the circuit in balance. In the embodiment, the voltage output from the drain of the PMOS transistor P41 is termed as sensing voltage VSE.

To keep the current of the PMOS transistor P43 unchanged (must be the same as the current source $I_3$), the drain voltage level of the PMOS transistor P43 would ascend therewith when the sensing voltage VSE drops, that is to say the voltage level of the voltage-increasing signal UP would ascend. In the embodiment, the voltage level of the ascended voltage-increasing signal UP is considered as a logic high-level. On the other hand, in response to the dropping sensing voltage VSE, in order to make the same current pass through the NMOS transistor N43 (must be the same as the current source $I_2$), the drain voltage level of the NMOS transistor N43 would ascend therewith; that is to say, the voltage level of the voltage-decreasing signal DN would ascend. In the embodiment, the voltage level of the ascended voltage-decreasing signal DN is considered as a logic high-level as well.

On the contrary, when the input voltage VINT is less than the output voltage VOUT, the sensing voltage VSE would ascend. Thus, the voltage-increasing signal UP and the voltage-decreasing signal DN would retain a lower voltage level. In the embodiment, the above-mentioned voltage-increasing signal UP and the voltage-decreasing signal DN with a lower voltage level are considered as a logic low-level.

Under another status that the input voltage VINT is equal to the output voltage VOUT, all of the PMOS transistors P41 and P42 and the NMOS transistors N41 and N42 are on, while the gate voltages of the PMOS transistor P43 and the NMOS transistor N43 are sensing voltages VSE. Therefore, the logic levels of the voltage-increasing signal UP and the voltage-decreasing signal DN are determined by the current amounts of the current sources $I_3$ and $I_2$. In the embodiment, when the input voltage VINT is equal to the output voltage VOUT, the voltage-increasing signal UP becomes a logic low-level, while the voltage-decreasing signal DN becomes a logic high-level.

As described in FIG. 4, the relative magnitude between the input voltage VINT and the output voltage VOUT can be decided by using the voltage level variations of the voltage-increasing signal UP and the voltage-decreasing signal DN.

Figure 5:
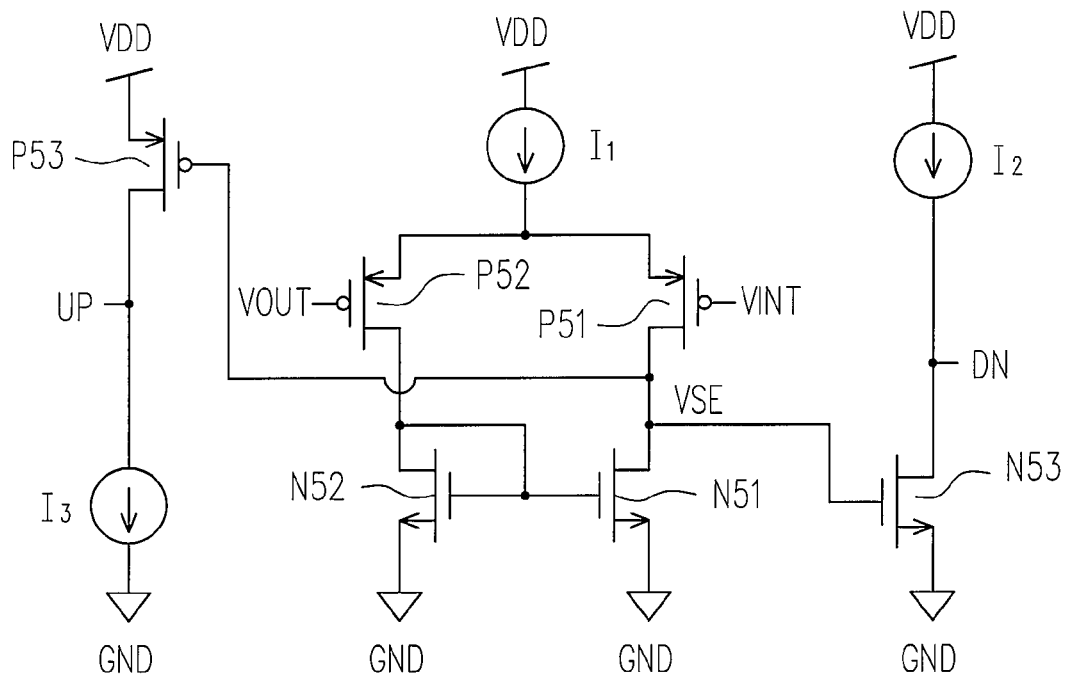
FIG. 5 is a schematic circuit drawing of a voltage detector according to another embodiment of the present invention.

FIG. 5 is a schematic circuit drawing of a voltage detector according to another embodiment of the present invention. The major difference of FIG. 5 from FIG. 4 lies in the circuit for generating the sensing voltage VSE. A voltage detector 500 includes PMOS transistors P51-P53, NMOS transistors N51-N53 and current sources $I_1$, $I_2$ and $I_3$. The PMOS transistor P51 and the NMOS transistor N51 are in series connection to each other and together coupled between the current source $I_1$ and the ground terminal GND, while the gate of the PMOS transistor P51 is coupled to the input voltage VINT. The PMOS transistor P52 and the NMOS transistor N52 are in series connection to each other and together coupled between the current source $I_1$ and the ground terminal GND, while the gate of the PMOS transistor P52 is coupled to the output voltage VOUT. The gates of the NMOS transistors N52 and N51 are coupled to the drain of the NMOS transistor N52. The common node of the PMOS transistor P51 and the NMOS transistor N51 outputs the sensing voltage VSE.

The sensing voltage VSE is coupled to the gates of the NMOS transistor N53 and the PMOS transistor P53, respectively. The common node of the current source $I_2$ and the NMOS transistor N53 outputs the voltage-decreasing signal DN, while the common node of the current source $I_3$ and the PMOS transistor P53 outputs the voltage-increasing signal UP.

When the input voltage VINT is equal to the output voltage VOUT, the voltage level of the sensing voltage VSE can be regulated by the current passing through the current source $I_1$, while the voltage-increasing signal UP and the voltage-decreasing signal DN are affected by the sensing voltage VSE to vary therewith. In the embodiment, when the input voltage VINT is equal to the output voltage VOUT, the voltage-increasing signal UP is logic low, while the voltage-decreasing signal DN is logic high, which are the same as the above-mentioned embodiment in FIG. 4.

When the input voltage VINT is greater than the output voltage VOUT, the sensing voltage VSE drops, which further makes both the voltage-increasing signal UP and the voltage-decreasing signal DN are logic high. When the input voltage VINT is less than the output voltage VOUT, the sensing voltage VSE ascends, which makes both the voltage-increasing signal UP and the voltage-decreasing signal DN are logic low.

Figure 6A:
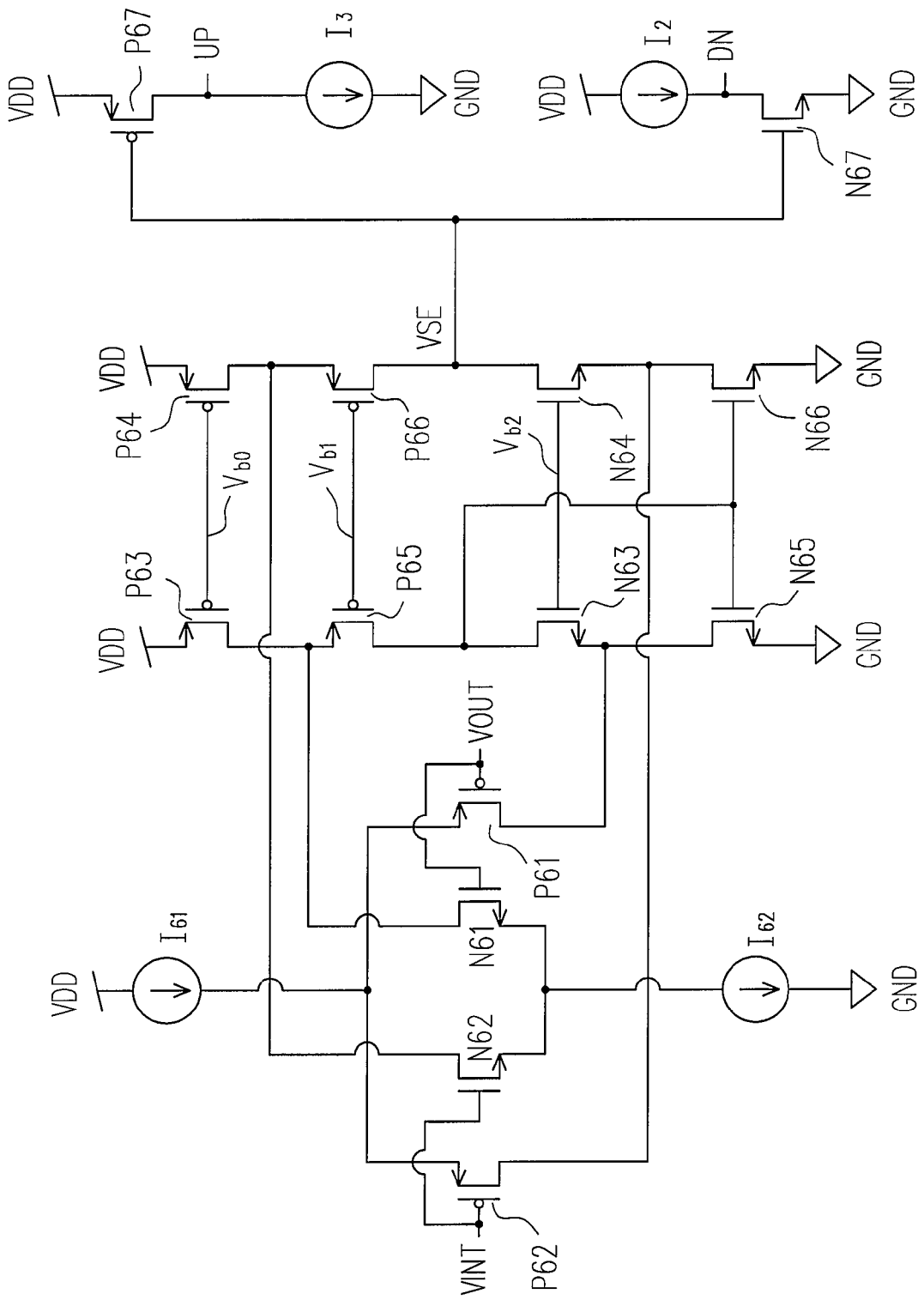
FIG. 6A is a schematic circuit drawing of a voltage detector according to another embodiment of the present invention.

FIG. 6A is a schematic circuit drawing of a voltage detector according to another embodiment of the present invention. A voltage detector 600 includes NMOS transistors N61-N67, PMOS transistors P61-P67 and current sources $I_{61}$-$I_{62}$ and $I_2$-$I_3$.

Both the gate of the NMOS transistor N61 and the gate of the PMOS transistor P61 are coupled to the output voltage VOUT, while both the gate of the NMOS transistor N62 and the gate of the PMOS transistor P62 are coupled to the input voltage VINT. The current source $I_{61}$ is coupled to the source of the PMOS transistor P61 and the source of the PMOS transistor P62, respectively. The current source $I_{62}$ is coupled to the source of the NMOS transistor N61 and the source of the NMOS transistor N62, respectively.

The PMOS transistor P63 is coupled between the operation voltage VDD and the drain of the NMOS transistor N61, the PMOS transistor P64 is coupled between the operation voltage VDD and the drain of the NMOS transistor N62, and both the gate of the PMOS transistor P64 and the gate of the PMOS transistor P63 are coupled to a bias voltage $V_{b0}$. The source of the PMOS transistor P65 is coupled to the drain of the PMOS transistor P63, the source of the PMOS transistor P66 is coupled to the drain of the PMOS transistor P64, and both the gate of the PMOS transistor P66 and the gate of the PMOS transistor P65 are coupled to a bias voltage $V_{b1}$.

The drain of the NMOS transistor N63 is coupled to the drain of the PMOS transistor P65, while the source of the NMOS transistor N63 is coupled to the drain of the PMOS transistor P61. The drain of the NMOS transistor N64 is coupled to the drain of the PMOS transistor P66, the source of the NMOS transistor N64 is coupled to the drain of the PMOS transistor P62, and both the gate of the NMOS transistor N64 and the gate of the NMOS transistor N63 are coupled to a bias voltage $V_{b2}$.

The NMOS transistor N65 is coupled between the source of the NMOS transistor N63 and the ground terminal GND, while the gate of the NMOS transistor N65 is coupled to the drain of the NMOS transistor N63. The NMOS transistor N66 is coupled between the source of the NMOS transistor N64 and the ground terminal GND, while the gate of the NMOS transistor N66 is coupled to the gate of the NMOS transistor N65. The NMOS transistor N67 is coupled between the current source $I_2$ and the ground terminal GND, while the gate of the NMOS transistor N67 is coupled to the common node of the PMOS transistor P66 and the NMOS transistor N64.

The PMOS transistor P67 is coupled between the operation voltage VDD and the current source $I_3$, while the gate of the PMOS transistor P67 is coupled to the common node of the PMOS transistor P66 and the NMOS transistor N64. Herein the common node of the NMOS transistor N67 and the current source $I_2$ outputs the voltage-decreasing signal DN, while the common node of the PMOS transistor P67 and the current source $I_3$ outputs the voltage-increasing signal UP.

The common node of the PMOS transistor P66 and the NMOS transistor N64 outputs the sensing voltage VSE and the voltage level of the sensing voltage VSE is determined by the variations of the input voltage VINT and the output voltage VOUT. The voltage levels of the voltage-increasing signal UP and the voltage-decreasing signal DN are determined by the variation of the sensing voltage VSE.

In the embodiment, when the input voltage VINT is equal to the output voltage VOUT, the voltage-increasing signal UP is logic low, while the voltage-decreasing signal DN is logic high. When the input voltage VINT is greater than the output voltage VOUT, the sensing voltage VSE drops, which further makes both the voltage-increasing signal UP and the voltage-decreasing signal DN to been logic high. When the input voltage VINT is less than the output voltage VOUT, the sensing voltage VSE ascends, which makes both the voltage-increasing signal UP and the voltage-decreasing signal DN to been logic low. All these are the same as the embodiments of FIGS. 4 and 5.

Anyone skilled in the art should be able to derive the circuit operation details of the above-described embodiments in FIGS. 4-6A from the given disclosure of the present invention without any difficulty, therefore the circuit operation details are omitted to describe for simplicity. Moreover, the schemes for generating the voltage-increasing signal UP and the voltage-decreasing signal DN are not limited by the above-described circuits of FIGS. 4-6A as well, wherein the crucial point is the comparison result between the input voltage VINT and the output voltage VOUT must be obtained.

Figure 6B:
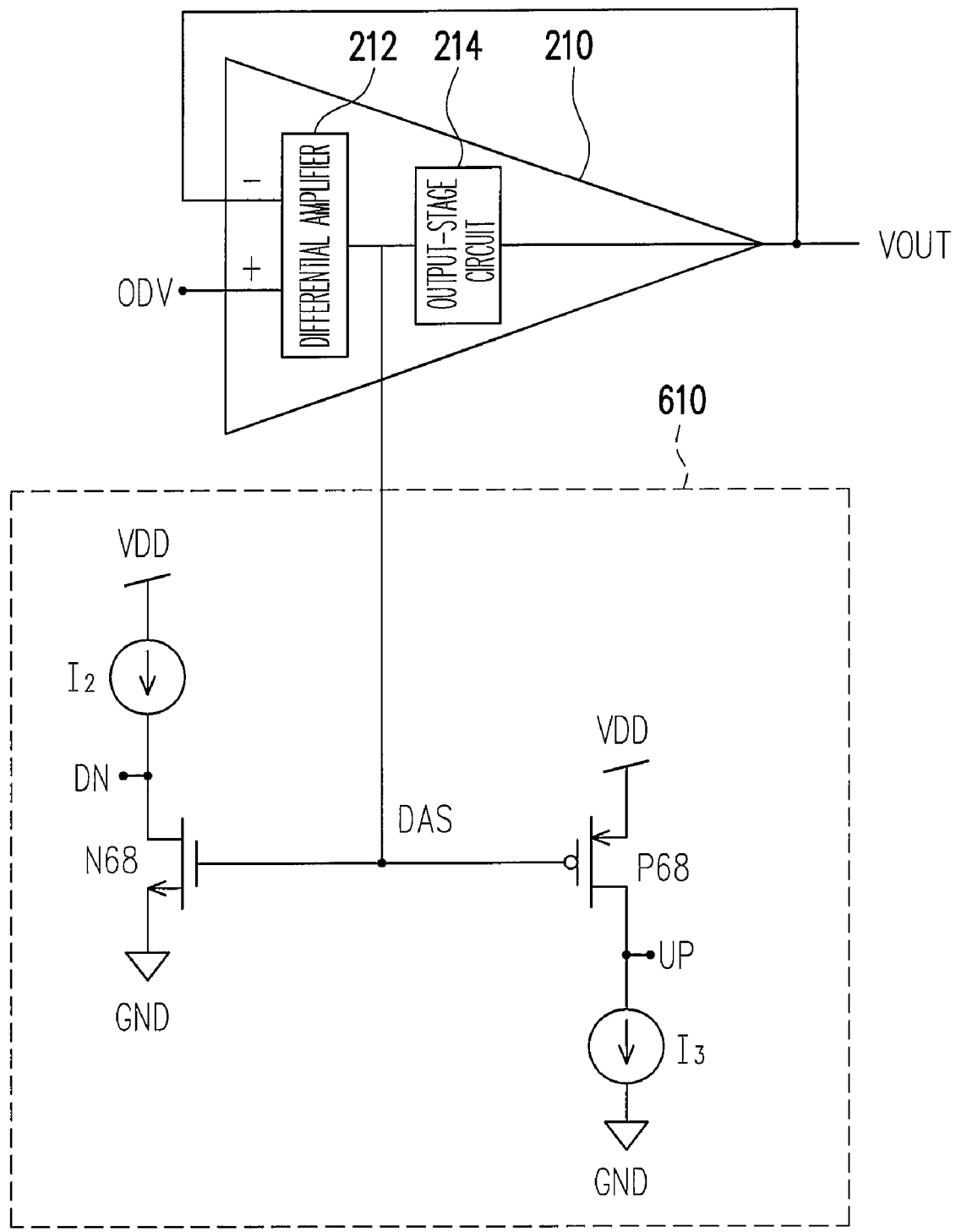
FIG. 6B is a schematic circuit drawing of a voltage detector according to another embodiment of the present invention.

FIG. 6B is a schematic circuit drawing of a voltage detector according to another embodiment of the present invention. A voltage detector 610 detects the variation of the input voltage VINT mainly by using a differential amplified signal DAS in the operational amplifier 210 and outputs the voltage-increasing signal UP and the voltage-decreasing signal DN. In the embodiment, the operational amplifier 210 includes a differential amplifier 212 and an output-stage circuit 214. The differential amplifier 212 outputs the differential amplified signal DAS to the output-stage circuit 214 according to the signals received at the positive input terminal and the negative input terminal thereof. In the prior art, the operational amplifier usually has a differential circuit architecture for receiving an differential input signal, amplifying the received signal, amplifying the signal again through an output-stage circuit in a second time and then generating an output signal. Anyone skilled in the art should be able to derive the internal architecture of the above-described operational amplifier from the given disclosure of the present invention without any difficulty, therefore the internal architecture is omitted to describe for simplicity.

As shown by FIG. 6B, the voltage detector 610 detects the variation of the input voltage VINT by using a differential amplified signal DAS generated inside the operational amplifier 210. Since the overdriving voltage ODV would be firstly regulated with the variation of the input voltage VINT (referring to the descriptions of FIGS. 3A and 3B), therefore, when the input voltage VINT varies, the overdriving voltage ODV would be regulated to the input voltage VINT. At the same time, the differential amplified signal DAS accordingly varies therewith and the manner of altering the voltage level thereof is similar to the above described sensing voltage VSE. In addition, the voltage detectors 400 and 500 also use a circuit structure similar to the differential amplifier as the input stage of the comparator for comparing the input voltage VINT with the output voltage VOUT, therefore, in the embodiment, the voltage detector 610 directly uses the differential amplified signal DAS generated inside the operational amplifier 210 to generate the corresponding voltage-increasing signal UP and voltage-decreasing signal DN, which further simplifies the circuit architecture of the voltage detector 610 and saves the circuit design cost.

The voltage detector 610 includes an NMOS transistor N68, a PMOS transistor P68 and current sources $I_2$ and $I_3$. The current source $I_2$ and the NMOS transistor N68 are coupled between the operation voltage VDD and the ground terminal GND. The PMOS transistor P68 and the current source $I_3$ are coupled between the operation voltage VDD and the ground terminal GND. Both the gates of the NMOS transistor N68 and the PMOS transistor P68 are coupled to the differential amplified signal DAS. Herein the common node of the PMOS transistor P68 and the current source $I_3$ outputs the voltage-increasing signal UP, while the common node of the current source $I_2$ and the NMOS transistor N68 outputs the voltage-decreasing signal DN.

Referring to FIG. 2, in the following, the control unit 224 is further described. The control unit 224 outputs a charging signal PH1, a first path signal PH2P, a second path signal PH2N and a restoration signal PH2 for controlling the voltage-regulating circuit 226 to generate the overdriving voltage ODV according to the voltage-increasing signal UP and the voltage-decreasing signal DN output from the voltage detector 222.

FIG. 7A is a schematic circuit drawing of a control unit according to an embodiment of the present invention. A control unit 700 includes a clock-regulating circuit 710, a first control circuit 720, a second control circuit 730 and a restoration circuit 740. The clock-regulating circuit 710 outputs the charging signal PH1 and a reference signal PH20 according to a clock signal CLK, while the first control circuit 720 outputs the first path signal PH2P according to the voltage-increasing signal UP and the reference signal PH20. The second control circuit 730 outputs the second path signal PH2N according to the voltage-decreasing signal DN and the reference signal PH20. The restoration circuit 740 outputs the restoration signal PH2 according to the voltage-increasing signal UP, the voltage-decreasing signal DN and the reference signal PH20.

The clock-regulating circuit 710 includes a delay circuit 712, an NOT-OR (NOR) gate 714, an NOT-AND (NAND) gate 716 and an inverter 718. The delay unit 712 receives a clock signal CLK and after delaying the received signal outputs a delayed clock signal DCLK. The delay unit 712 comprises a plurality of delay components, for example, inverters. In the embodiment, the delay unit 712 comprises four inverters.

The input terminal of the NOR gate 714 is respectively coupled to the output terminal of the delay unit 712 and the clock signal CLK and outputs the reference signal PH20 according to the delayed clock signal DCLK and the clock signal CLK. The NAND gate 716 performs an NAND logic operation on the delayed clock signal DCLK and the clock signal CLK, and then outputs the charging signal PH1 via the inverter 718.

The first control circuit 720 includes an NAND gate 722 and an inverter 724. After performing a NAND logic operation on the voltage-increasing signal UP and the reference signal PH20, the NAND gate 722 outputs the first path signal PH2P via the inverter 724.

The second control circuit 730 includes an inverter 732, an NAND gate 734 and an inverter 736. The voltage-decreasing signal DN is coupled to the NAND gate 734 via the inverter 732, the NAND gate 734 performs a NAND logic operation on the inverted voltage-decreasing signal DN and the reference signal PH20 and then outputs the second path signal PH2N via the inverter 736.

The restoration circuit 740 includes an inverter 742, an NAND gate 744 and an inverter 746. Herein the NAND gate has three input terminals. The voltage-increasing signal UP is coupled to the NAND gate 744 via the inverter 742, the NAND gate 744 performs a NAND logic operation on the inverted voltage-increasing signal UP, the voltage-decreasing signal DN and the reference signal PH20 and then outputs the restoration signal PH2 via the inverter 746.

Herein the charging signal PH1, the first path signal PH2P and the second path signal PH2N are not overlapped by each other during the enabling duration; and during every period, only one of the first path signal PH2P and the second path signal PH2N is enabled.

The waveforms of the associated signals in an embodiment of the present invention in connection with FIG. 2 are explained hereinafter. FIG. 7B is a diagram of the signals according to the embodiment of FIG. 7A. In the embodiment of FIG. 7B, in terms of the signal relationship, the logic high indicates, for example, an enabling duration. However, in another embodiment of the present invention, the logic low can also indicate an enabling duration, wherein an appropriate modification of FIG. 7A is made, for example, by adding an inverter at the output terminal. Anyone skilled in the art should be able to derive the appropriate modification from the given disclosure of the present invention without any difficulty, therefore they are omitted to describe for simplicity.

As shown in FIG. 7B, after the clock signal CLK is enabled and thereafter with a delay of time (caused by the delay unit 712), the charging signal PH1 starts to be enabled and the enabling duration of the charging signal PH1 is called as a charging duration T1. The enabling durations of the reference signal PH20 and the charging signal PH1 are not overlapped by each other (which can be derived from the clock-regulating circuit 710).

During the charging duration T1, the switches S1 and S2 are on and the charging voltage dV starts to charge the capacitor C. Then, during an overdriving duration T2, one of the first path signal PH2P and the second path signal PH2N would be decided to be enabled according to the comparison result between the input voltage VINT and the output voltage VOUT. If the input voltage VINT is greater than the output voltage VOUT, the first path signal PH2P is enabled during the duration T2, wherein the switches S3 and S4 are on and the overdriving voltage ODV is greater than the input voltage VINT (that is, the overdriving voltage ODV is equal to the sum of the input voltage VINT and the voltage difference at the two terminals of the capacitor C); if the input voltage VINT is less than the output voltage VOUT, the second path signal PH2N is enabled during the duration T2, wherein the switches S5 and S6 are on and the overdriving voltage ODV is less than the input voltage VINT (that is, the overdriving voltage ODV is equal to the input voltage VINT less the voltage difference at the two terminals of the capacitor C).

After the overdriving duration, the restoration signal PH2 is enabled. The enabling duration of the restoration signal PH2 is called as the restoration duration T3. During the restoration duration T3, the switch S7 is on and the overdriving voltage ODV is equal to the input voltage VINT. During the enabling duration of the restoration signal PH2, the switch S1 and the switch S2 can be on or kept off depending on the design requirement, while the voltage buffer continues to be operated normally.

On the other hand, if the input voltage VINT is equal to the output voltage VOUT, both the first path signal PH2P and the second path signal PH2N are disabled (which means both the first path signal PH2P and the second path signal PH2N are logic low in the embodiment).

In summary, since the voltage buffer of the present invention uses the overdriving scheme to convert the input voltage into an enlarged overdriving voltage, thus, the driving capability is enhanced and the slew rate of the voltage buffer is furthermore increased.

The above-described voltage buffer can be applied in a source driver of an LCD because the voltage buffer possesses the stronger driving capability and the higher slew rate. Hence, the source driver is suitable for driving a LCD panel with a larger dimension or a larger capacitance load to further improve the display quality thereof.

FIG. 8A is a schematic circuit drawing of a control unit according to another embodiment of the present invention. A control unit 800 outputs a first path signal PH2P, a second path signal PH2N and a restoration signal PH2 according to the voltage-increasing signal UP and the voltage-decreasing signal DN output from the voltage detector 222. Referring to FIGS. 3A and 3B, the control unit 800 in association with the voltage-regulating circuit 226 of the embodiment in FIG. 3A or the voltage-regulating circuit 300 of the embodiment in FIG. 3B regulates the level of the overdriving voltage ODV. The control unit 800 includes inverters 810 and 820 and an AND gate 830. As shown by FIG. 8A, the inverter 810 receives the voltage-increasing signal UP, inverts the received signal and outputs an inverted voltage-increasing signal UPB to the AND gate 830. The AND gate 830 outputs a restoration signal PH2 according to the inverted voltage-increasing signal UPB and the voltage-decreasing signal DN. The inverter 820 receives the voltage-decreasing signal DN, inverts the received signal and outputs the inverted signal as the second path signal PH2N, while the voltage-increasing signal UP herein can be directly served as the first path signal PH2P. In the embodiment, the logic high (logic '1') indicates the enabling state and the relationships between the above-mentioned signals are listed in table 1 (in the table, '1' and '0' respectively indicate the logic high state and the logic low state, and all the signal marks are the same as the above described):

TABLE 1

| State | DN | UP | PH2P | PH2N | PH2 |
|---|---|---|---|---|---|
| VINT = VOUT | 1 | 0 | 0 | 0 | 1 |
| VINT > VOUT | 1 | 1 | 1 | 0 | 0 |
| VINT < VOUT | 0 | 0 | 0 | 1 | 0 |

Please refer to FIGS. 3A and 3B for the following description. As indicated by Table 1, in the state of VINT=VOUT (in FIG. 3A), the restoration signal PH2 is enabled, the switches S1, S2 and S7 are on (herein the restoration signal PH2, instead of the charging signal PH1, is used to control the switches S1 and S2), the charging voltage dV charges the capacitor C, a positive voltage difference is generated between the first terminal CP1 and the second terminal CP2 of the capacitor C, and the overdriving voltage ODV is equal to the input voltage VINT at the point. In the state of VINT>VOUT, the first path signal PH2P is enabled and the switches S3 and S4 are on, so as to make the overdriving voltage ODV greater than the input voltage VINT. In the state of VINT<VOUT, the second path signal PH2N is enabled and the switches S5 and S6 are on so as to make the overdriving voltage ODV less than the input voltage VINT. It can be seen from the above that for each of the above-mentioned states, only one signal among the first path signal PH2P, the second path signal PH2N and the restoration signal PH2 can take the enabling state at a time.

FIG. 8B is a diagram of the signals according to the embodiment of FIG. 8A. As shown in FIG. 8B, during the overdriving duration T81, when VINT≠VOUT, one of the first path signal PH2P and the second path signal PH2N is logic high which indicates the enabling state. Referring to FIG. 8B, if VINT>VOUT, the first path signal PH2P is enabled; if VINT<VOUT, the second path signal PH2N is enabled. During the restoration duration T82, VINT=VOUT and the restoration signal PH2 is the logic high which indicates the enabling state. In addition, in FIG. 3B, if VINT=VOUT, the restoration signal PH2 is enabled and the switch S10 is on, which makes the overdriving voltage ODV equal to the input voltage VINT; if VINT>VOUT, the first path signal PH2P is enabled and the switch S8 is on, which makes the overdriving voltage ODV greater than the input voltage VINT; if VINT>VOUT, the second path signal PH2N is enabled and the switch S9 is on, which makes the overdriving voltage ODV less than the input voltage VINT.

Figure 9:
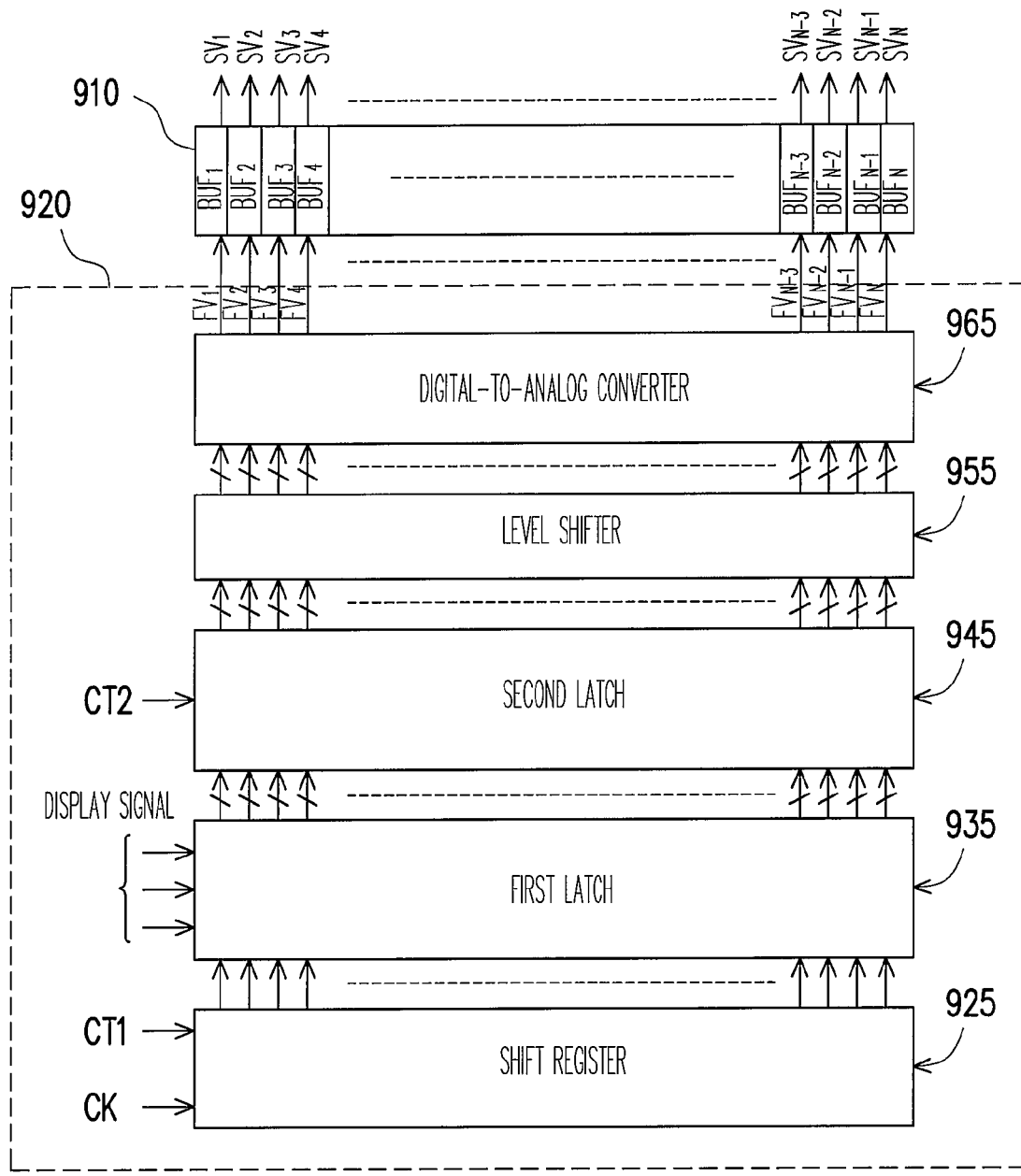
FIG. 9 is a block diagram of a source driver according to another embodiment of the present invention.

FIG. 9 is a block diagram of a source driver according to another embodiment of the present invention. A source driver 900 includes a buffer unit 910 and a driving unit 920. The driving unit 920 generates a plurality of first driving signals $FV_1$-$FV_N$ according to the display signals. The buffer unit 910 is coupled to the driving unit 920 and includes a plurality of voltage buffers $BUF_1$-$BUF_N$. The voltage buffers $BUF_1$-$BUF_N$ are corresponding to the first driving signals $FV_1$-$FV_N$ in one-to-one manner and respectively output corresponding second driving signals $SV_1$-$SV_N$ for driving an LCD panel according to the first driving signals.

In the embodiment, each of the voltage buffers $BUF_1$-$BUF_N$ has a same architecture as shown by FIG. 2. Therefore, the above-mentioned first driving signals $FV_1$-$FV_N$ are respectively corresponding to the input voltage VINT of the voltage buffer 200 in FIG. 2, and the above-mentioned second driving signals $SV_1$-$SV_N$ are respectively corresponding to the output voltage VOUT of the voltage buffer 200. The operation details of the voltage buffers $BUF_1$-$BUF_N$ can refer to the depictions of the embodiments in FIGS. 2-8B and are omitted to describe for simplicity.

The driving unit 920 includes a shift register 925, a first latch 935, a second latch 945, a level shifter 955 and a digital-to-analog converter (DAC) 965. In the embodiment, all of the shift register 925, the first latch 935 and the second latch 945 are together termed as a shift latch unit mainly for latching display signals (for example, an RGB display signal) and for latching and outputting the display signals according to a clock signal CK, a first control signal CT1 and a second control signal CT2. Herein the shift register 925 outputs a shift signal according to the clock signal CK and the first control signal CT1. The first latch 935 of the latch unit is coupled to the shift register 925 and sequentially latches the display signals according to a shift signal. The second latch 945 of the shift latch unit is coupled to the first latch 935 and latches and outputs the latch result of the first latch 935 according to the second control signal CT2.

After the voltage levels of the outputs from the above-mentioned second latch 945 are regulated by the level shifter 955, the DAC 965 would further convert the regulated signal into analog signals (for example, voltage signals), that is the first driving signals $FV_1$-$FV_N$. The first driving signals $FV_1$-$FV_N$ pass the corresponding voltage buffers $BUF_1$-$BUF_N$ and then the second driving signals $SV_1$-$SV_N$ are output.

Taking the voltage buffer $BUF_1$ as an example, herein the received input voltage is the first driving signal $FV_1$ and the output voltage is the second driving signal $SV_1$. When the first driving signal $FV_1$ is changed, the voltage detector inside the voltage buffer $BUF_1$ would compare the first driving signal $FV_1$ with the corresponding second driving signal $SV_1$. If the first driving signal $FV_1$ is greater than the second driving signal $SV_1$, the voltage buffer $BUF_1$ would generate an overdriving voltage greater than the first driving signal $FV_1$. On the contrary, if the first driving signal $FV_1$ is less than the second driving signal $SV_1$, the voltage buffer $BUF_1$ would generate an overdriving voltage less than the first driving signal $FV_1$.

By using the overdriving voltage, the voltage buffer $BUF_1$ will have a more powerful driving capability, which further advances the slew rate of the voltage buffer $BUF_1$. In other words, the speed to alter the second driving signal $SV_1$ is enhanced, which makes the second driving signal $SV_1$ equal to the first driving signal $FV_1$ more quickly. The operation details of the voltage buffers $BUF_1$-$BUF_N$ can refer to the depictions of the embodiments in FIGS. 2-8B and are omitted to describe for simplicity.

Figure 10:
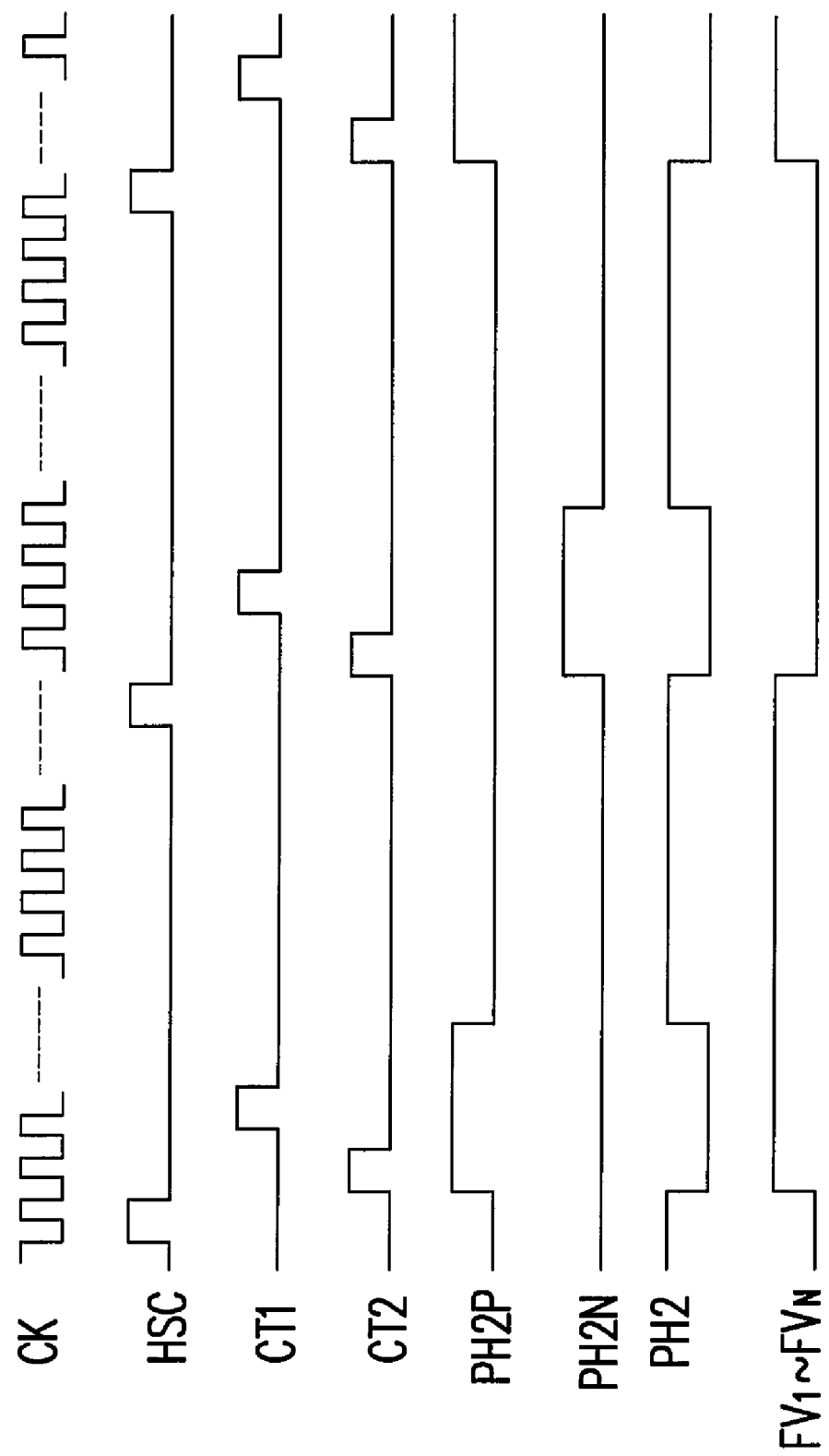
FIG. 10 is a diagram of the signals according to the embodiment of FIG. 9.

In the following, the timing signals to coordinate the source driver and the voltage buffer are described to further explain the technical means of the embodiment. Herein, FIGS. 3A, 8A and 8B are referred. FIG. 10 is a diagram of the signals according to the embodiment of FIG. 9. The first/second path signal PH2P/PH2N and the restoration signal PH2 can refer to the depiction of FIG. 8B. In the embodiment, the charging signal PH1 of FIG. 3A is controlled by the timing of the restoration signal PH2.

The clock signal CK is the periodic impulse wave which is served as the reference for the operation of the shift register 925. The period of the horizontal synchronization signal HSC can represent the period for the source driver 900 for driving a gate line. When the first control signal CT1 is triggered, the shift latch unit starts to perform a shifting and latching operation on the display signals; when the second control signal CT2 is triggered, the second latch 945 in the shift latch unit latches and outputs the latch result of the first latch 935, which further generates a digital driving signal.

It can be seen from the above that the period of the second control signal CT2 is corresponding to the period for altering the first driving signals $FV_1$-$FV_N$. That is to say, when the digital driving signal is changed, the first driving signals $FV_1$-$FV_N$ vary therewith. Thus, during each period of the second control signal CT2, the voltage buffers $BUF_1$-$BUF_N$ respectively regulate the corresponding second driving signals $SV_1$-$SV_N$ according to the first/second path signal PH2P/PH2N and the restoration signal PH2.

The above-mentioned signal waveforms in FIG. 10 are corresponding to the situation where the voltage-regulating circuit in the voltage buffers $BUF_1$-$BUF_N$ adopts the circuit architecture of FIG. 3A. However, the circuit architecture of FIG. 3B is suitable for the voltage-regulating circuit in the voltage buffers $BUF_1$-$BUF_N$ as well. Anyone skilled in the art should be able to derive the coordinating manner thereof from the given disclosure of the present invention without any difficulty, therefore it is omitted to describe for simplicity.

Since the voltage buffers $BUF_1$-$BUF_N$ possess a better slew rate, thus, the source driver 900 is suitable for an LCD panel with a larger dimension or a larger capacitance load. When the load capacitance is increased with a larger panel dimension, or a same voltage buffer 200 needs to drive more than one data line load, or a same voltage buffer 200 needs to time after time drive different data line loads during a same time of the horizontal synchronization signal HSC (for example, for the source driving mode of low temperature poly silicon), the source driver 900 is still competent to enhance the driving capability thereof and to retain a better slew rate by using the overdriving scheme.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage buffer, comprising:
   an operational amplifier, having a positive input terminal, a negative input terminal and an output terminal, wherein the output terminal is coupled to the negative input terminal and outputs an output voltage; and
   an overdriving unit, coupled between an input voltage and the operational amplifier for comparing the input voltage with the output voltage and outputting an overdriving voltage to the positive input terminal of the operational amplifier;
   wherein if the input voltage is greater than the output voltage, the overdriving unit makes the overdriving voltage greater than the input voltage; if the input voltage is less than the output voltage, the overdriving unit makes the overdriving voltage less than the input voltage; if the input voltage is equal to the output voltage, the overdriving voltage is equal to the input voltage.

2. The voltage buffer according to claim 1, wherein the overdriving unit comprises:
   a voltage detector, used for comparing the input voltage with the output voltage and outputting a voltage-increasing signal and a voltage-decreasing signal;
   a control unit, coupled to the voltage detector and outputting a control signal according to the voltage-increasing signal and the voltage-decreasing signal; and
   a voltage-regulating circuit, coupled to the control unit and regulating the level of the overdriving voltage according to the control signal output from the control unit.

3. The voltage buffer according to claim 2, wherein the voltage detector comprises:
   a first PMOS transistor, being serially connected to a first NMOS transistor, and the first PMOS transistor and the first NMOS transistor are coupled between a first operation voltage and a first current source, wherein the gate of the first NMOS transistor is coupled to the input voltage;
   a second PMOS transistor, being serially connected to a second NMOS transistor, and the second PMOS transistor and the second NMOS transistor are coupled between the first operation voltage and the first current source, wherein the gate of the second NMOS transistor is coupled to the output voltage, the gate of the second PMOS transistor is coupled to the gate of the first PMOS transistor and the gate of the second PMOS transistor is coupled to the common node of the second PMOS transistor and the second NMOS transistor;
   a second current source, being serially connected to a third NMOS transistor, and the second current source and the third NMOS transistor are coupled between the first operation voltage and a second operation voltage, wherein the gate of the third NMOS transistor is coupled to the common node of the first PMOS transistor and the first NMOS transistor, and the common node of the second current source and the third NMOS transistor outputs the voltage-decreasing signal; and
   a third PMOS transistor, being serially connected to a third current source, and the third PMOS transistor and the third current source are coupled between the first operation voltage and the second operation voltage, wherein the gate of the third PMOS transistor is coupled to the common node of the first PMOS transistor and the first NMOS transistor, and the common node of the third PMOS transistor and the third current source outputs the voltage-increasing signal.

4. The voltage buffer according to claim 2, wherein the voltage detector comprises:
   a first PMOS transistor, being serially connected to a first NMOS transistor, and the first PMOS transistor and the first NMOS transistor are coupled between a first current source and a second operation voltage, wherein the gate of the first PMOS transistor is coupled to the input voltage;
   a second PMOS transistor, being serially connected to a second NMOS transistor, and the second PMOS transistor and the second NMOS transistor are coupled between the first current source and the second operation voltage, wherein the gate of the second PMOS transistor is coupled to the output voltage, the gate of the second NMOS transistor is coupled to the gate of the first NMOS transistor and the gate of the second NMOS transistor is coupled to the common node of the second PMOS transistor and the second NMOS transistor;

a second current source, being serially connected to a third NMOS transistor, and the second current source and the third NMOS transistor are coupled between a first operation voltage and the second operation voltage, wherein the gate of the third NMOS transistor is coupled to the common node of the first PMOS transistor and the first NMOS transistor, and the common node of the second current source and the third NMOS transistor outputs the voltage-decreasing signal; and a third PMOS transistor, being serially connected to a third current source, and the third PMOS transistor and the third current source are coupled between the first operation voltage and the second operation voltage, wherein the gate of the third PMOS transistor is coupled to the common node of the first PMOS transistor and the first NMOS transistor, and the common node of the third PMOS transistor and the third current source outputs the voltage-increasing signal.

5. The voltage buffer according to claim 2, wherein the voltage detector comprises:

a first NMOS transistor, wherein both the gate of the first NMOS transistor and the gate of a first PMOS transistor are coupled to the output voltage;

a second NMOS transistor, wherein both the gate of the second NMOS transistor and the gate of a second PMOS transistor are coupled to the input voltage;

a first current source, coupled to the source of the first PMOS transistor and the source of the second PMOS transistor;

a second current source, coupled to the source of the first NMOS transistor and the source of the second NMOS transistor;

a third PMOS transistor, coupled between a first operation voltage and the drain of the first NMOS transistor;

a fourth PMOS transistor, coupled between the first operation voltage and the drain of the second NMOS transistor, wherein both the gate of the fourth PMOS transistor and the gate of the third PMOS transistor are coupled to a first bias voltage;

a fifth PMOS transistor, wherein the source of the fifth PMOS transistor is coupled to the drain of the third PMOS transistor;

a sixth PMOS transistor, wherein the source of the sixth PMOS transistor is coupled to the drain of the fourth PMOS transistor, and both the gate of the sixth PMOS transistor and the gate of the fifth PMOS transistor are coupled to a second bias voltage;

a third NMOS transistor, wherein the drain of the third NMOS transistor is coupled to the drain of the fifth PMOS transistor, and the source of the third NMOS transistor is coupled to the drain of the first PMOS transistor;

a fourth NMOS transistor, wherein the drain of the fourth NMOS transistor is coupled to the drain of the sixth PMOS transistor, both the gate of the fourth NMOS transistor and the gate of the third NMOS transistor are coupled to a third bias voltage, and the source of the fourth NMOS transistor is coupled to the drain of the second PMOS transistor;

a fifth NMOS transistor, coupled between the source of the third NMOS transistor and a second operation voltage, wherein the gate of the fifth NMOS transistor is coupled to the drain of the third NMOS transistor;

a sixth NMOS transistor, coupled between the source of the fourth NMOS transistor and the second operation voltage, wherein the gate of the sixth NMOS transistor is coupled to the gate of the fifth NMOS transistor;

a seventh NMOS transistor, coupled between a third current source and the second operation voltage, wherein the gate of the seventh NMOS transistor is coupled to the common node of the sixth PMOS transistor and the fourth NMOS transistor;

a seventh PMOS transistor, coupled between the first operation voltage and a fourth current source, wherein the gate of the seventh PMOS transistor is coupled to the common node of the sixth PMOS transistor and the fourth NMOS transistor;

wherein the common node of the seventh NMOS transistor and the third current source outputs the voltage-decreasing signal, while the common node of the seventh PMOS transistor and the fourth current source outputs the voltage-increasing signal.

6. The voltage buffer according to claim 2, wherein the operational amplifier comprises a differential amplifier and an output-stage circuit, the differential amplifier outputs a differential signal to the output-stage circuit according to the signals received by the positive input terminal and the negative input terminal, and the voltage detector comprises:

an NMOS transistor, coupled between a first current source and a second operation voltage, wherein the gate of the NMOS transistor is coupled to the output terminal of the differential amplifier; and a PMOS transistor, coupled between a first operation voltage and a second current source, wherein the gate of the PMOS transistor is coupled to the output terminal of the differential amplifier;

wherein the common node of the NMOS transistor and the first current source outputs the voltage-decreasing signal, while the common node of the PMOS transistor and the second current source outputs the voltage-increasing signal.

7. The voltage buffer according to claim 2, wherein the control unit outputs a charging signal, a first path signal, a second path signal and a restoration signal for regulating the output of the voltage-regulating circuit, and the control unit comprises:

a clock-regulating circuit, outputting the charging signal and a reference signal according to a clock signal;

a first control circuit, outputting the first path signal according to the voltage-increasing signal and the reference signal;

a second control circuit, outputting the second path signal according to the voltage-decreasing signal and the reference signal; and a restoration circuit, outputting the restoration signal according to the voltage-increasing signal, the voltage-decreasing signal and the reference signal.

8. The voltage buffer according to claim 7, wherein the clock-regulating circuit comprises:

a delay circuit, used for delaying the clock signal and outputting a delayed clock signal;

an NOR gate, coupled to the delay circuit and outputting the reference signal according to the delayed clock signal and the clock signal; and an NAND gate, coupled to the delay circuit and outputting the charging signal via an inverter according to the delayed clock signal and the clock signal.

9. The voltage buffer according to claim 8, wherein the delay circuit comprises an even number of inverters.

10. The voltage buffer according to claim 7, wherein the first control circuit comprises:
- an NAND gate, wherein an input terminal of the NAND gate is coupled to the voltage-increasing signal, while another input terminal of the NAND gate is coupled to the reference signal; and
- an inverter, wherein the input terminal of the inverter is coupled to the output terminal of the NAND gate and the inverter outputs the first path signal.

11. The voltage buffer according to claim 7, wherein the second control circuit comprises:
- a first inverter, wherein the input terminal of the first inverter is coupled to the voltage-decreasing signal;
- an NAND gate, wherein an input terminal of the NAND gate is coupled to the output terminal of the first inverter, while another input terminal of the NAND gate is coupled to the reference signal; and
- a second inverter, wherein the input terminal of the second inverter is coupled to the output terminal of the NAND gate and outputs the second path signal.

12. The voltage buffer according to claim 7, wherein the restoration circuit comprises:
- a first inverter, wherein the input terminal of the first inverter is coupled to the voltage-increasing signal;
- an NAND gate, having three input terminals coupled to the output terminal of the first inverter, the voltage-decreasing signal and the reference signal, respectively; and
- a second inverter, wherein the input terminal of the second inverter is coupled to the output terminal of the NAND gate and the second inverter outputs the restoration signal.

13. The voltage buffer according to claim 7, wherein the voltage-regulating circuit comprises:
- a capacitor, having a first terminal and a second terminal;
- a first switch, coupled between a charging voltage and the first terminal of the capacitor;
- a second switch, coupled between the second terminal of the capacitor and a ground terminal;
- a third switch, coupled between the second terminal of the capacitor and the input voltage;
- a fourth switch, coupled between the first terminal of the capacitor and the positive input terminal of the operational amplifier;
- a fifth switch, coupled between the input voltage and the first terminal of the capacitor;
- a sixth switch, coupled between the second terminal of the capacitor and the positive input terminal of the operational amplifier; and
- a seventh switch, coupled between the positive input terminal of the operational amplifier and the input voltage;
- wherein if the charging signal is enabled, the first switch and the second switch are on; if the first path signal is enabled, the third switch and the fourth switch are on; if the second path signal is enabled, the fifth switch and the sixth switch are on; if the restoration signal is enabled, the seventh switch is on.

14. The voltage buffer according to claim 13, wherein the charging signal is enabled during a charging duration; if the charging voltage is greater than the output voltage, the first path signal is enabled during an overdriving duration; if the input voltage is less than the output voltage, the second path signal is enabled during the overdriving duration; the overdriving duration is after the charging duration.

15. The voltage buffer according to claim 14, wherein after the overdriving duration, the restoration signal is enabled during a restoration duration.

16. The voltage buffer according to claim 13, wherein the charging signal is enabled during a charging duration; if the charging signal is enabled, the seventh switch is on; if the input voltage is greater than the output voltage, the first path signal is enabled during an overdriving duration; if the input voltage is less than the output voltage, the second path signal is enabled during the overdriving duration; the overdriving duration is after the charging duration.

17. The voltage buffer according to claim 16, wherein after the overdriving duration, the restoration signal is enabled during a restoration duration, and if the restoration signal is enabled, the first switch and the second switch are either on or off.

18. The voltage buffer according to claim 7, wherein when the charging signal is logic high, the charging signal is enabled; when the first path signal is logic high, the first path signal is enabled; when the second path signal is logic high, the second path signal is enabled; when the restoration signal is logic high, the restoration signal is enabled.

19. The voltage buffer according to claim 2, wherein the control unit outputs a first path signal, a second path signal and a restoration signal for regulating the output of the voltage-regulating circuit, and the control unit comprises:
- a first inverter, used for inverting the voltage-increasing signal and outputting an inverted voltage-increasing signal;
- an AND gate, used for generating the restoration signal according to the voltage-decreasing signal and the inverted voltage-increasing signal; and
- a second inverter, used for inverting the voltage-decreasing signal and outputting the second path signal;
- wherein the control unit directly outputs the first path signal according to the voltage-increasing signal.

20. The voltage buffer according to claim 19, wherein the voltage-regulating circuit comprises:
- a capacitor, having a first terminal and a second terminal;
- a first switch, coupled between a charging voltage and the first terminal of the capacitor;
- a second switch, coupled between the second terminal of the capacitor and a ground terminal;
- a third switch, coupled between the second terminal of the capacitor and the input voltage;
- a fourth switch, coupled between the first terminal of the capacitor and the positive input terminal of the operational amplifier;
- a fifth switch, coupled between the input voltage and the first terminal of the capacitor;
- a sixth switch, coupled between the second terminal of the capacitor and the positive input terminal of the operational amplifier; and
- a seventh switch, coupled between the positive input terminal of the operational amplifier and the input voltage;
- wherein if the first path signal is enabled, the third switch and the fourth switch are on; if the second path signal is enabled, the fifth switch and the sixth switch are on; if the restoration signal is enabled, the first switch, the second switch and the seventh switch are on.

21. The voltage buffer according to claim 20, wherein if the input voltage is greater than the output voltage, the first path signal is enabled during an overdriving duration; if the input voltage is less than the output voltage, the second path signal is enabled during the overdriving duration.

22. The voltage buffer according to claim 21, wherein after the overdriving duration, the restoration signal is enabled during a restoration duration.

23. The voltage buffer according to claim 19, wherein the voltage-regulating circuit comprises:
   a first resistor, coupled between a first current source and the input voltage, wherein another terminal of the first current source is coupled to a first operation voltage;
   a second resistor, coupled between the input voltage and a second current source, wherein another terminal of the second current source is coupled to a second operation voltage;
   a first switch, wherein a terminal of the first switch is coupled to the common node of the first resistor and the first current source, while another terminal of the first switch is coupled to the positive input terminal of the operational amplifier;
   a second switch, wherein a terminal of the second switch is coupled to the common node of the second resistor and the second current source, while another terminal of the second switch is coupled to the positive input terminal of the operational amplifier; and
   a third switch, coupled between the positive input terminal of the operational amplifier and the input voltage;
   wherein if the first path signal is enabled, the first switch is on; if the second path signal is enabled, the second switch is on; if the restoration signal is enabled, the third switch is on.

24. The voltage buffer according to claim 19, wherein when the inverted voltage-decreasing signal is logic high, the second path signal is enabled; when the voltage-increasing signal is logic high, the first path signal is enabled; when the restoration signal is logic high, the restoration signal is enabled.

25. The voltage buffer according to claim 23, wherein the first operation voltage is greater than or equal to a system operation voltage.

26. The voltage buffer according to claim 23, wherein the second operation voltage is less than or equal to a system ground voltage.

27. The voltage buffer according to claim 2, wherein if the input voltage is greater than the output voltage, the voltage-increasing signal is logic high and the voltage-decreasing signal is logic high.

28. The voltage buffer according to claim 2, wherein if the input voltage is less than the output voltage, the voltage-increasing signal is logic low and the voltage-decreasing signal is logic low.

29. The voltage buffer according to claim 2, wherein if the input voltage is equal to the output voltage, the voltage-increasing signal is logic low and the voltage-decreasing signal is logic high.

30. A source driver, used for driving an LCD panel, the source driver comprising:
   a driving unit, generating a plurality of first driving voltages according to an input display signal; and
   a plurality of voltage buffers, coupled to the driving unit and outputting a plurality of second driving voltages according to the first driving voltages;
   wherein each of the voltage buffers has an operational amplifier and an overdriving unit, the overdriving unit outputs an overdriving voltage to the operational amplifier according to the corresponding first driving voltage, each of the voltage buffers regulates the corresponding second driving voltage according to the corresponding overdriving voltage for driving the LCD panel, and the overdriving unit is coupled between the corresponding first driving voltage and the operational amplifier for comparing the first driving voltage with the second driving voltage and outputting the overdriving voltage to a positive input terminal of the operational amplifier.

31. The source driver according to claim 30, wherein the operational amplifier further, comprises a negative in put terminal and an output terminal, the output terminal is coupled to the negative in put terminal, and the output terminal outputs the second driving voltage.

32. The source driver according to claim 30, wherein if the first driving voltage is greater than the second driving voltage, the overdriving voltage is greater than the first driving voltage; if the first driving voltage is less than the second driving voltage, the overdriving voltage is less than the first driving voltage; if the first driving voltage is equal to the second driving voltage, the overdriving voltage is equal to the first driving voltage.

33. The source driver according to claim 32, wherein the overdriving unit comprises:
   a voltage detector, used for comparing the first driving voltage with the second driving voltage and outputting a voltage-increasing signal and a voltage-decreasing signal;
   a control unit, coupled to the voltage detector and outputting a control signal according to the voltage-increasing signal and the voltage-decreasing signal; and
   a voltage-regulating circuit, coupled to the control unit and regulating the voltage level of the overdriving voltage according to the control signal output from the control unit.

34. The source driver according to claim 33, wherein the voltage detector comprises:
   a first PMOS transistor, being serially connected to a first NMOS transistor, and the first PMOS transistor and the first NMOS transistor are coupled between a first operation voltage and a first current source, wherein the gate of the first NMOS transistor is coupled to the first driving voltage;
   a second PMOS transistor, being serially connected to a second NMOS transistor, and the second PMOS and the second NMOS transistor are coupled between the first operation voltage and the first current source, wherein the gate of the second NMOS transistor is coupled to the second driving voltage, the gate of the second PMOS transistor is coupled to the gate of the first PMOS transistor and the gate of the second PMOS transistor is coupled to the common node of the second PMOS transistor and the second NMOS transistor;
   a second current source, being serially connected to a third NMOS transistor, and the second current source and the third NMOS transistor are coupled between the first operation voltage and a second operation voltage, wherein the gate of the third NMOS transistor is coupled to the common node of the first PMOS transistor and the first NMOS transistor, and the common node of the second current source and the third NMOS transistor outputs the voltage-decreasing signal; and
   a third PMOS transistor, being serially connected to a third current source, and the third PMOS transistor and the third current source are coupled between the first operation voltage and the second operation voltage, wherein the gate of the third PMOS transistor is coupled to the common node of the first PMOS transistor and the first NMOS transistor, and the common node of the third PMOS transistor and the third current source outputs the voltage-increasing signal.

35. The source driver according to claim 33, wherein the voltage detector comprises:

a first PMOS transistor, being serially connected to a first NMOS transistor, and the first PMOS transistor and the first NMOS transistor are coupled between a first current source and a second operation voltage, wherein the gate of the first PMOS transistor is coupled to the first driving voltage;

a second PMOS transistor, being serially connected to a second NMOS transistor, and the second PMOS transistor and the second NMOS transistor are coupled between the first current source and the second operation voltage, wherein the gate of the second PMOS transistor is coupled to the second driving voltage, the gate of the second NMOS transistor is coupled to the gate of the first NMOS transistor and the gate of the second NMOS transistor is coupled to the common node of the second PMOS transistor and the second NMOS transistor;

a second current source, being serially connected to a third NMOS transistor, and the second current source and the third NMOS transistor are coupled between a first operation voltage and the second operation voltage, wherein the gate of the third NMOS transistor is coupled to the common node of the first PMOS transistor and the first NMOS transistor, and the common node of the second current source and the third NMOS transistor outputs the voltage-decreasing signal; and a third PMOS transistor, being serially connected to a third current source, and the third PMOS transistor and the third current source are coupled between the first operation voltage and the second operation voltage, wherein the gate of the third PMOS transistor is coupled to the common node of the first PMOS transistor and the first NMOS transistor, and the common node of the third PMOS transistor and the third current source outputs the voltage-increasing signal.

36. The source driver according to claim 33, wherein the voltage detector comprises:

a first NMOS transistor, wherein both the gate of the first NMOS transistor and the gate of a first PMOS transistor are coupled to the second driving voltage;

a second NMOS transistor, wherein both the gate of the second NMOS transistor and the gate of a second PMOS transistor are coupled to the first driving voltage;

a first current source, coupled to the source of the first PMOS transistor and the source of the second PMOS transistor;

a second current source, coupled to the source of the first NMOS transistor and the source of the second NMOS transistor;

a third PMOS transistor, coupled between a first operation voltage and the drain of the first NMOS transistor;

a fourth PMOS transistor, coupled between the first operation voltage and the drain of the second NMOS transistor, wherein both the gate of the fourth PMOS transistor and the gate of the third PMOS transistor are coupled to a first bias voltage;

a fifth PMOS transistor, wherein the source of the fifth PMOS transistor is coupled to the drain of the third PMOS transistor;

a sixth PMOS transistor, wherein the source of the sixth PMOS transistor is coupled to the drain of the fourth PMOS transistor, and both the gate of the sixth PMOS transistor and the gate of the fifth PMOS transistor are coupled to a second bias voltage;

a third NMOS transistor, wherein the drain of the third NMOS transistor is coupled to the drain of the fifth PMOS transistor, and the source of the third NMOS transistor is coupled to the drain of the first PMOS transistor;

a fourth NMOS transistor, wherein the drain of the fourth NMOS transistor is coupled to the drain of the sixth PMOS transistor, both the gate of the fourth NMOS transistor and the gate of the third NMOS transistor are coupled to a third bias voltage, and the source of the fourth NMOS transistor is coupled to the drain of the second PMOS transistor;

a fifth NMOS transistor, coupled between the source of the third NMOS transistor and a second operation voltage, wherein the gate of the fifth NMOS transistor is coupled to the drain of the third NMOS transistor;

a sixth NMOS transistor, coupled between the source of the fourth NMOS transistor and the second operation voltage, wherein the gate of the sixth NMOS transistor is coupled to the gate of the fifth NMOS transistor;

a seventh NMOS transistor, coupled between a third current source and the second operation voltage, wherein the gate of the seventh NMOS transistor is coupled to the common node of the sixth PMOS transistor and the fourth NMOS transistor;

a seventh PMOS transistor, coupled between the first operation voltage and a fourth current source, wherein the gate of the seventh PMOS transistor is coupled to the common node of the sixth PMOS transistor and the fourth NMOS transistor;

wherein the common node of the seventh NMOS transistor and the third current source outputs the voltage-decreasing signal, while the common node of the seventh PMOS transistor and the fourth current source outputs The voltage-increasing signal.

37. The source driver according to claim 33, wherein the operational amplifier comprises a differential amplifier and an output-stage circuit, the differential amplifier outputs a differential signal to the output-stage circuit according to the signals received by the positive input terminal and the negative input terminal, and the voltage detector comprises:

an NMOS transistor, coupled between a first current source and a second operation voltage, wherein the gate of the NMOS transistor is coupled to the output terminal of the differential amplifier; and a PMOS transistor, coupled between a first operation voltage and a second current source, wherein the gate of the PMOS transistor is coupled to the output terminal of the differential amplifier;

wherein the common node of the NMOS transistor and the first current source outputs the voltage-decreasing signal, while the common node of the PMOS transistor and the second current source outputs the voltage-increasing signal.

38. The source driver according to claim 33, wherein the control unit outputs a charging signal, a first path signal, a second path signal and a restoration signal for regulating the output of the voltage-regulating circuit, and the control unit comprises:

a clock-regulating circuit, outputting the charging signal and a reference signal according to a clock signal;

a first control circuit, outputting the first path signal according to the voltage-increasing signal and the reference signal;

a second control circuit, outputting the second path signal according to the voltage-decreasing signal and the reference signal; and a restoration circuit, outputting the restoration signal according to the voltage-increasing signal, the voltage-decreasing signal and the reference signal.

39. The source driver according to claim 38, wherein the clock-regulating circuit comprises:
a delay circuit, used for delaying the clock signal and outputting a delayed clock signal;
an NOR gate, coupled to the delay circuit and outputting the reference signal according to the delayed clock signal and the clock signal; and
an NAND gate, coupled to the delay circuit and outputting the charging signal via an inverter according to the delayed clock signal and the clock signal.

40. The source driver according to claim 39, wherein the delay circuit comprises an even number of inverters.

41. The source driver according to claim 38, wherein the first control circuit comprises:
an NAND gate, wherein an input terminal of the NAND gate is coupled to the voltage-increasing signal, while another input terminal of the NAND gate is coupled to the reference signal; and
an inverter, wherein the input terminal of the inverter is coupled to the output terminal of the NAND gate and the inverter outputs the first path signal.

42. The source driver according to claim 38, wherein the second control circuit comprises:
a first inverter, wherein the input terminal of the first inverter is coupled to the voltage-decreasing signal;
an NAND gate, wherein an input terminal of the NAND gate is coupled to the output terminal of the first inverter, while another input terminal of the NAND gate is coupled to the reference signal; and
a second inverter, wherein the input terminal of the second inverter is coupled to the output terminal of the NAND gate and the second inverter outputs the second path signal.

43. The source driver according to claim 38, wherein the restoration circuit comprises:
a first inverter, wherein the input terminal of the first inverter is coupled to the voltage-increasing signal;
an NAND gate, having three input terminals coupled to the output terminal of the first inverter, the voltage-decreasing signal and the reference signal, respectively; and
a second inverter, wherein the input terminal of the second inverter is coupled to the output terminal of the NAND gate and the second inverter outputs the restoration signal.

44. The source driver according to claim 38, wherein the voltage-regulating circuit comprises:
a capacitor, having a first terminal and a second terminal;
a first switch, coupled between a charging voltage and the first terminal of the capacitor;
a second switch, coupled between the second terminal of the capacitor and a ground terminal;
a third switch, coupled between the second terminal of the capacitor and the first driving voltage;
a fourth switch, coupled between the first terminal of the capacitor and the positive input terminal of the operational amplifier;
a fifth switch, coupled between the first driving voltage and the first terminal of the capacitor;
a sixth switch, coupled between the second terminal of the capacitor and the positive input terminal of the operational amplifier; and
a seventh switch, coupled between the positive input terminal of the operational amplifier and the first driving voltage;

wherein if the charging signal is enabled, the first switch and the second switch are on; if the first path signal is enabled, the third switch and the fourth switch are on; if the second path signal is enabled, the fifth switch and the sixth switch are on; if the restoration signal is enabled, the seventh switch is on.

45. The source driver according to claim 44, wherein the charging signal is enabled during a charging duration; if the first driving voltage is greater than the second driving voltage, the first path signal is enabled during an overdriving duration; if the first driving voltage is less than the second driving voltage, the second path signal is enabled during the overdriving duration; the overdriving duration is after the charging duration, and if the restoration signal is enabled, the overdriving voltage is equal to the first driving voltage.

46. The source driver according to claim 45, wherein after the overdriving duration, the restoration signal is enabled during a restoration duration.

47. The source driver according to claim 44, wherein the charging signal is enabled during a charging duration; if the charging signal is enabled, the seventh switch is on; if the first driving voltage is greater than the second driving voltage, the first path signal is enabled during a overdriving duration; if the first driving voltage is less than the second driving voltage, the second path signal is enabled during the overdriving duration; the overdriving duration is after the charging duration.

48. The source driver according to claim 47, wherein after the overdriving duration, the restoration signal is enabled during a restoration duration, and if the restoration signal is enabled, the first switch and the second switch are either on or off.

49. The source driver according to claim 38, wherein when the charging signal is logic high, the charging signal is enabled; when the first path signal is logic high, the first path signal is enabled; when the second path signal is logic high, the second path signal is enabled; when the restoration signal is logic high, the restoration signal is enabled.

50. The source driver according to claim 33, wherein the control unit outputs a first path signal, a second path signal and a restoration signal for regulating the output of the voltage-regulating circuit, and the control unit comprises:
a first inverter, used for inverting the voltage-increasing signal and outputting an inverted voltage-increasing signal;
an AND gate, used for generating the restoration signal according to the voltage-decreasing signal and the inverted voltage-increasing signal; and
a second inverter, used for inverting the voltage-decreasing signal and outputting the second path signal;
wherein the control unit directly outputs the first path signal according to the voltage-increasing signal.

51. The source driver according to claim 50, wherein the voltage-regulating circuit comprises:
a capacitor, having a first terminal and a second terminal;
a first switch, coupled between a charging voltage and the first terminal of the capacitor;
a second switch, coupled between the second terminal of the capacitor and a ground terminal;
a third switch, coupled between the second terminal of the capacitor and the first driving voltage;
a fourth switch, coupled between the first terminal of the capacitor and the positive input terminal of the operational amplifier;
a fifth switch, coupled between the first driving voltage and the first terminal of the capacitor;

a sixth switch, coupled between the second terminal of the capacitor and the positive input terminal of the operational amplifier; and a seventh switch, coupled between the positive input terminal of the operational amplifier and the first driving voltage;

wherein if the first path signal is enabled, the third switch and the fourth switch are on; if the second path signal is enabled, the fifth switch and the sixth switch are on; if the restoration signal is enabled, the first switch, the second switch and the seventh switch are on.

52. The source driver according to claim 51, wherein if the first driving voltage is greater than the second driving voltage, the first path signal is enabled during an overdriving duration; if the first driving voltage is less than the second driving voltage, the second path signal is enabled during the overdriving duration.

53. The source driver according to claim 52, wherein after the overdriving duration, the restoration signal is enabled during a restoration duration.

54. The source driver according to claim 50, wherein the voltage-regulating circuit comprises:

a first resistor, coupled between a first current source and the first driving voltage, wherein another terminal of the first current source is coupled to a first operation voltage;

a second resistor, coupled between the first driving voltage and a second current source, wherein another terminal of the second current source is coupled to a second operation voltage;

a first switch, wherein a terminal of the first switch is coupled to the common node of the first resistor and the first current source, while another terminal of the first switch is coupled to the positive input terminal of the operational amplifier;

a second switch, wherein a terminal of the second switch is coupled to the common node of the second resistor and the second current source, while another terminal of the second switch is coupled to the positive input terminal of the operational amplifier; and a third switch, coupled between the positive input terminal of the operational amplifier and the first driving voltage;

wherein if the first path signal is enabled, the first switch is on; if the second path signal is enabled, the second switch is on; if the restoration signal is enabled, the third switch is on.

55. The source driver according to claim 50, wherein when the inverted voltage-decreasing signal is logic high, the second path signal is enabled; when the voltage-increasing signal is logic high, the first path signal is enabled; when the restoration signal is logic high, the restoration signal is enabled.

56. The source driver according to claim 54, wherein the first operation voltage is greater than or equal to a system operation voltage.

57. The source driver according to claim 54, wherein the second operation voltage is less than or equal to a ground voltage.

58. The source driver according to claim 33, wherein if the first driving voltage is greater than the second driving voltage, the voltage-increasing signal is logic high and the voltage-decreasing signal is logic high.

59. The source driver according to claim 33, wherein if the first driving voltage is less than the second driving voltage, the voltage-increasing signal is logic low and the voltage-decreasing signal is logic high.

60. The source driver according to claim 33, wherein if the input voltage is equal to the output voltage, the voltage-increasing signal is logic low and the voltage-decreasing signal is logic high.

61. The source driver according to claim 29, wherein the driving unit comprises:

a shift latch unit, used for latching the display signal and outputting a digital driving signal;

a level shifter, coupled to the shift latch unit for regulating the voltage level of the digital driving signal and outputting the regulated digital driving signal;

a digital-to-analog converter, coupled to the level shifter and generating the first driving voltages according to the digital driving signal output from the level shifter.

62. The source driver according to claim 61, wherein the shift latch unit comprises:

a shift register, used for outputting a shift signal; and a latch unit, coupled to the shift register for latching the display signal according to the shift signal and outputting the digital driving signal.

63. The source driver according to claim 61, wherein the latch unit comprises:

a first latch, coupled to the shift register for latching the display signal step by step according to the shift signal; and a second latch, coupled to the first latch for outputting the digital driving signal according to the latch result of the first latch.

* * * * *